(12) United States Patent
Matsumoto

(10) Patent No.: US 7,445,519 B2
(45) Date of Patent: Nov. 4, 2008

(54) SEMICONDUCTOR DEVICE

(75) Inventor: Masafumi Matsumoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/760,270

(22) Filed: Jun. 8, 2007

(65) Prior Publication Data

US 2008/0124985 A1   May 29, 2008

(30) Foreign Application Priority Data

Nov. 24, 2006   (JP) .............................. 2006-317327

(51) Int. Cl.
*H01R 9/22*   (2006.01)
(52) U.S. Cl. ....................... 439/709; 257/690
(58) Field of Classification Search .................. 439/709; 257/690
See application file for complete search history.

(56) References Cited

U.S. PATENT DOCUMENTS

| | | | | |
|---|---|---|---|---|
| 3,245,029 A | * | 4/1966 | Piperato | 439/716 |
| 3,757,282 A | * | 9/1973 | Wildi | 439/491 |
| 6,521,983 B1 | * | 2/2003 | Yoshimatsu et al. | 257/678 |
| 7,048,591 B1 | * | 5/2006 | Chiang | 439/709 |
| 7,198,495 B1 | * | 4/2007 | Youtsey | 439/97 |
| 2006/0105637 A1 | * | 5/2006 | Chiang | 439/709 |
| 2008/0142948 A1 | * | 6/2008 | Matsumoto | 257/690 |

FOREIGN PATENT DOCUMENTS

| | | |
|---|---|---|
| JP | 10-116961 | 5/1998 |
| JP | 11-177259 | 7/1999 |
| JP | 2002-314035 | 10/2002 |

* cited by examiner

*Primary Examiner*—Truc T Nguyen
(74) *Attorney, Agent, or Firm*—Oblon, Spivak, McClelland, Maier & Neustadt, P.C.

(57) ABSTRACT

A screw block terminal is formed to have a block body, a nut, an electrode and an overhang portion, and the block body has first, second, third and fourth side surface portions, an upper surface portion and a lower surface portion. The overhang portion is extended from the first side surface portion of block body such that a sidewall portion is sandwiched between the overhang portion and the block body. A projection corresponding to wall-like bodies provided on a case member is formed on the overhang portion. On the third and fourth side surface portions, projected contact portions are formed, respectively, to enlarge a contact surface with an outer wall surface of the sidewall portion. Thus, a semiconductor device is provided that allows to improve resistance to tightening torpue of the screw block terminal.

10 Claims, 25 Drawing Sheets

SEMICONDUCTOR DEVICE

BACKGROUND OF THE INVENTION

1. Field of the Invention

The present invention relates to a semiconductor device and, more specifically, to a semiconductor device having a power semiconductor mounting board contained in a package.

2. Description of the Background Art

Semiconductor devices used for driving inverters of industrial equipment have various and many forms corresponding to the numbers of packages or switching elements such as an IGBT (Insulated Gate Bipolar Transistor), and the forms are denoted, for example, as 1in1, 2in1 or 7in1. Specifically, 1in1 denotes a semiconductor device having one switching element mounted on one package, and 2in1 denotes one having two switching elements mounted on one package, while 7in1 denotes a semiconductor device having a total of 7 switching elements, that is, 6 switching elements for a 3-phase inverter and one switching element for braking, mounted on one package.

Further, screw block terminals and pin terminals are attached to a semiconductor device, for connection to an external device or the like. A semiconductor device has such a structure that easily allows change in attachment position of such screw block terminal or pin terminal, in accordance with its form. Specifically, on a case member forming the package of a semiconductor device, wall-shaped fixing members extending from a sidewall portion are formed at a prescribed interval from each other, to provide a plurality of fixing positions along the periphery. A screw block terminal or a pin terminal is fixed by the fixing member at a prescribed position corresponding to its form. References disclosing general semiconductor devices having connection terminals for external connection include Japanese Patent Laying-Open Nos. 11-177259, 2002-314035 and 10-116961.

The conventional semiconductor, however, has the following problem. When the semiconductor device is connected to an external device, it is necessary to attach an external terminal such as a bus-bar, to a screw block terminal. Here, the bus-bar is attached to the screw block terminal, by inserting a screw to an opening of the bus-bar and by tightening the screw in a threaded hole formed in the screw block terminal. When the screw is tightened in the screw block terminal, however, the screw block terminal or the case member, on which the screw block terminal is fixed, may be damaged by the fastening stress. As a result, it is sometimes difficult to attain sufficient tightening torque and to securely attach the external terminal to the screw block terminal.

SUMMARY OF THE INVENTION

The present invention was made to solve the above-described problem, and its object is to provide a semiconductor device allowing improved resistance to tightening torque of the screw block terminal.

The present invention provides a semiconductor device including a case member, a screw block terminal and a stress relaxing portion. The case member has a base plate and a sidewall portion formed along an outer edge of the base plate, and houses a semiconductor mounting board. The screw block terminal is attached on the case member, and has a block body positioned outside the sidewall portion when attached to the case member and an overhang portion formed overhang from the block body to sandwich the sidewall portion with the block body to be fixed on the case member, and the external terminal is connected by putting in and tightening a screw into the block body. The stress relaxing portion is provided on the block body, and relaxes the stress experienced by the screw block terminal as the screw is tightened.

According to the present invention, the fastening stress generated at the screw block terminal by the operation of tightening the screw is dispersed by the stress relaxing portion, and therefore, local concentration of stress at a specific portion of the screw block terminal can be avoided. As a result, it becomes possible to fasten the screw in the screw block terminal with higher fastening torque, and hence, the resistance against the fastening torque can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
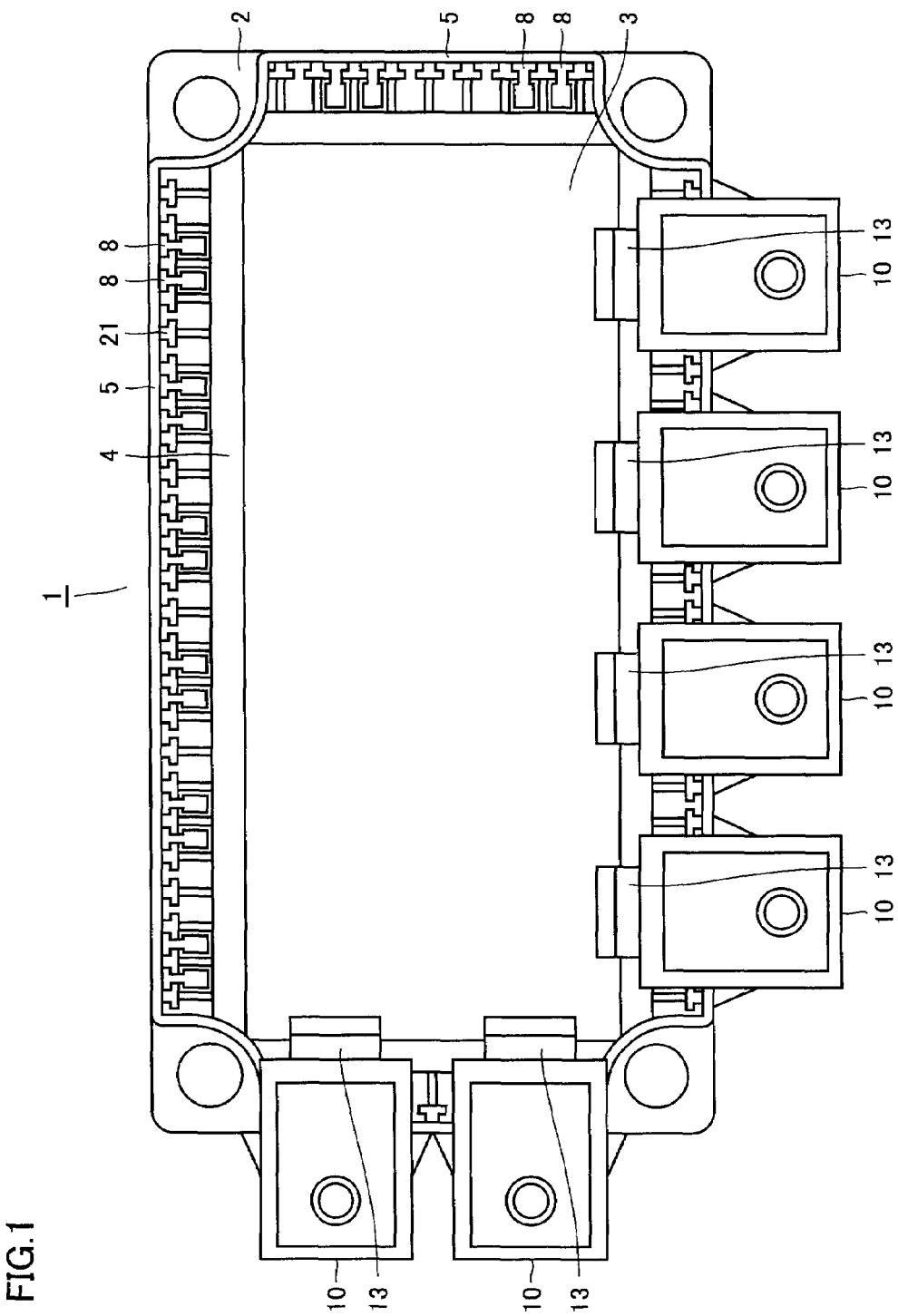
FIG. 1 is a top view of the semiconductor device in accordance with Embodiment 1 of the present invention.
Figure 2:
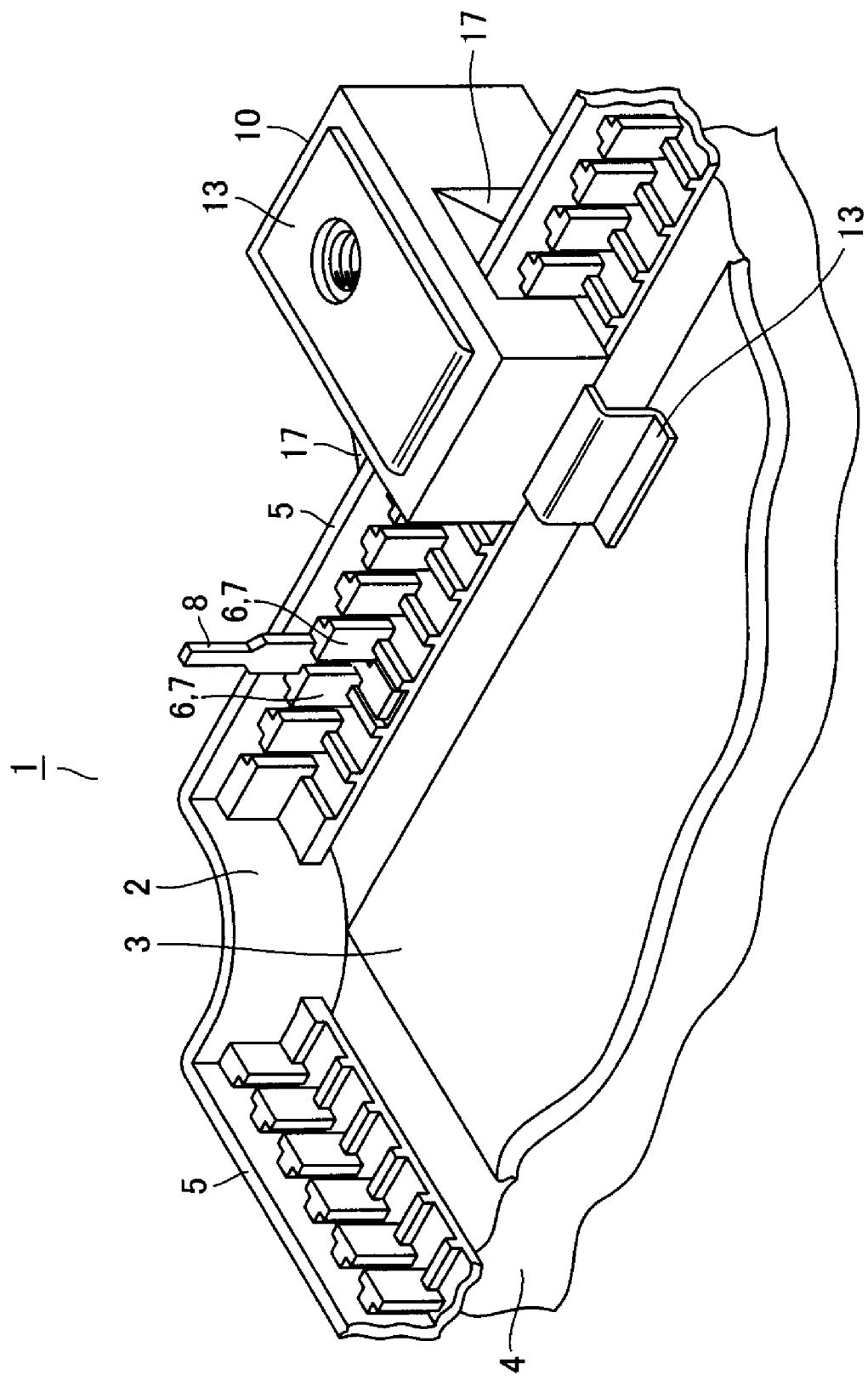
FIG. 2 is a partial perspective view showing an attachment portion where the screw block terminal is attached to the case member in accordance with the embodiment.

A semiconductor device in accordance with Embodiment 1 will be described. As shown in FIGS. 1 and 2, in a semiconductor 1, a semiconductor mounting board 3 is housed in a case member 2 with a bottom, as a package. On the bottom of case member 2, a base plate 4 is arranged, and semiconductor mounting board 3 is placed on base plate 4. On the outer periphery of base plate 4, a sidewall portion 5 of a prescribed height is formed along the outer edge.

On case member 2, a screw block terminal 10 and a pin terminal 8 are attached, as terminals for connecting semiconductor device 1 to external equipment (not shown). On the inside of sidewall portion 5, fixing members 6 are arranged, for fixing screw block terminal 10 and pin terminal 8 on case member 2. Fixing members 6 are a plurality of wall-like bodies 7 extending inward from the sidewall portion 5, and the plurality of wall-like bodies 7 are arranged at a prescribed interval between each other, along sidewall portion 5.

Pin terminal 8 is inserted to a space (region) surrounded by adjacent two wall-like bodies 7 and sidewall portion 5, and pinched by the adjacent two wall-like bodies 7, whereby it is fixed on case member 2. Screw block terminal 10 has a prescribed portion (overhang portion) to be fixed on wall-like body 7, and fixed on case member 2 thereby.

Figure 3:
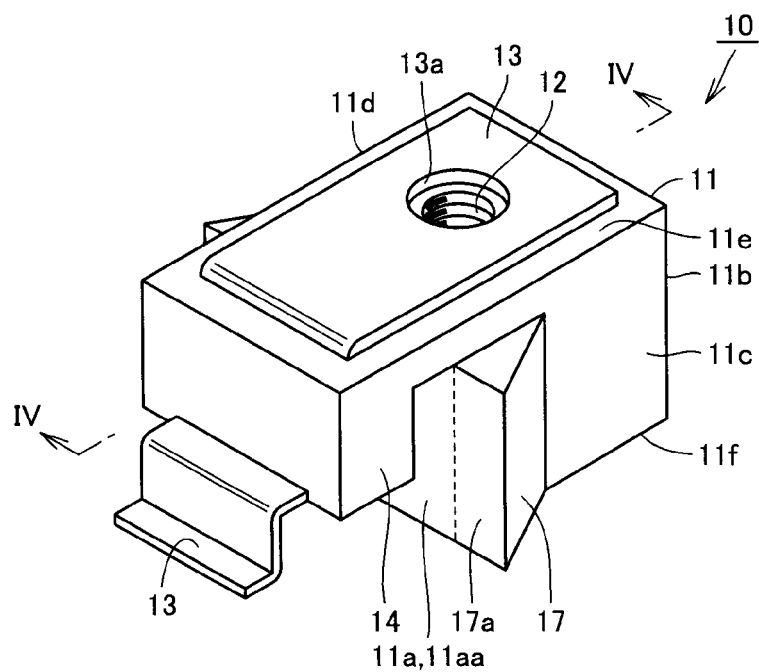
FIG. 3 is a perspective view showing the screw block terminal in accordance with the embodiment.

Screw block terminal 10 will be described in grater detail. As shown in FIG. 3, screw block terminal 10 is formed to have a block body 11, a nut 12, an electrode 13, and an overhang portion 14. Block body 11 has an approximately rectangular shape, and has a first, second, third and fourth side surface portions 11a, 11b, 11c, 11d, a top surface portion 11e and a bottom surface portion 11f. The first and second side surface portions 11a and 11b are opposite to each other, and the third and fourth side surface portions 11c and 11d are opposite to each other.

Figure 4:
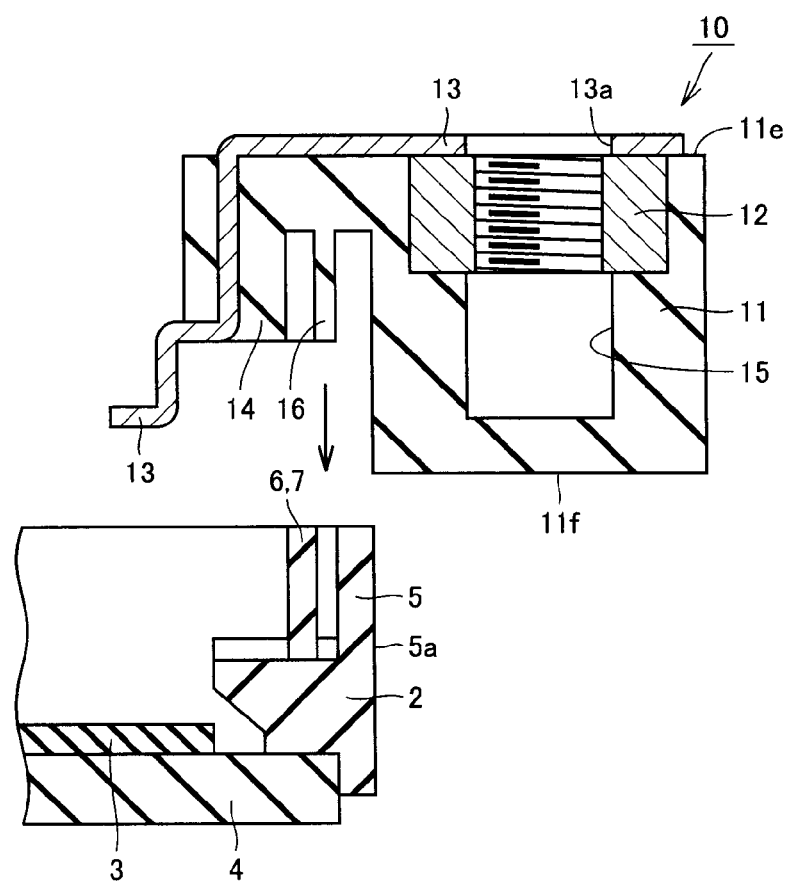
FIG. 4 is a partial cross-sectional view showing an attachment structure of the screw block terminal to the case member, taken along the section line IV-IV of FIG. 3 in accordance with the embodiment.

As shown in FIG. 4, block body 11 has a hollow portion 15, and nut 12 is arranged at an upper part of hollow portion 15. Overhang portion 14 extends from the first side surface portion 11a of block body 11 such that block body 11 and overhang portion 14 sandwich the sidewall portion 5. One end of electrode 13 is exposed at top surface portion 11e of block body 11, and the other end passes through the inside of overhang portion 14 and is exposed at the lower end portion of overhang portion 14. On the one side of electrode 13, an opening 13a coaxial with nut 12 is formed.

Figure 5:
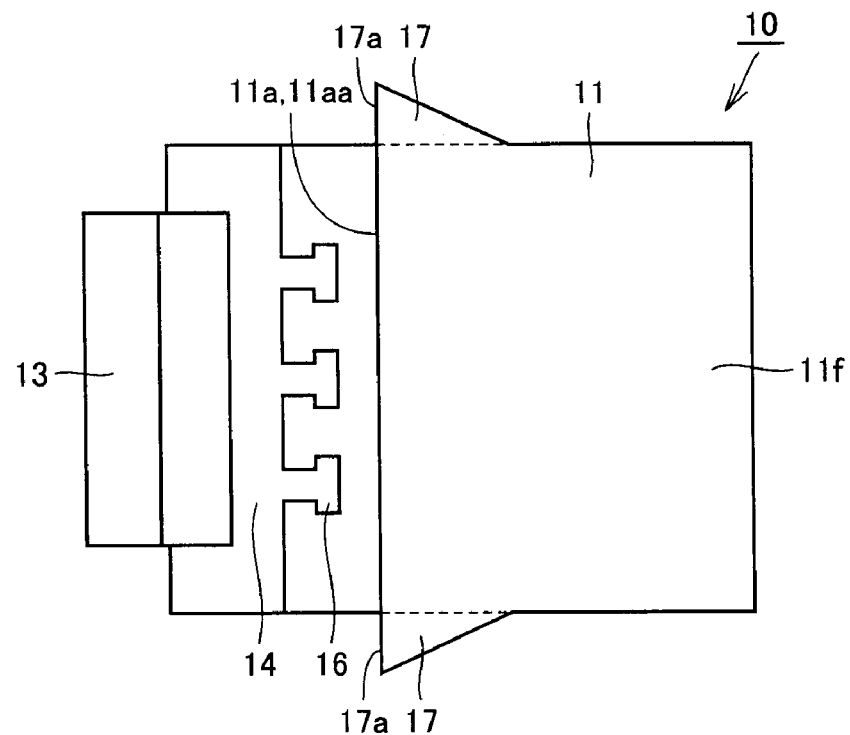
FIG. 5 is a bottom view of the screw block terminal in accordance with the embodiment.
Figure 6:
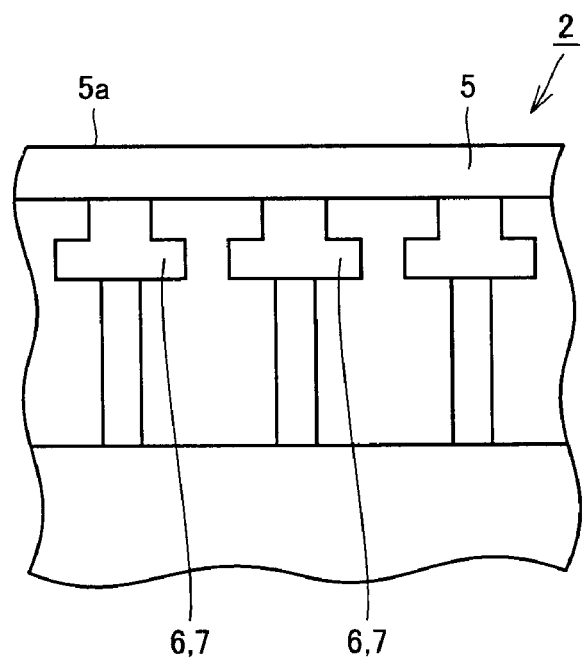
FIG. 6 is a partial top view showing a portion of the case member where the screw block terminal is attached, in accordance with the embodiment.

As shown in FIGS. 5 and 6, overhang portion 14 has a projection 16 that corresponds to the wall-like body 7 provided on case member 2. As shown in FIG. 4, screw block terminal 10 is fixed on case member 2, by inserting projection 16 into the space between wall-like bodies 7. With screw block terminal 10 fixed on case member 2, the first side surface portion 11a of screw block body 11 is in contact with an outer wall surface 5a of sidewall portion 5 of case member 2. As can be seen from FIGS. 3 and 5, screw block terminal 10 has, on the third and fourth side surface portions 11c and 11d of block body 11, projected contact portions 17.

Block body 11 and overhang portion 14 of screw block terminal 10 are formed by molding prescribed resin. Examples of the applicable resin include PET-PBT (polyethyleneterephtalate)-(polybutylene terephtalate), PBT, PPS (polyphenylene sulfide).

Figure 7:
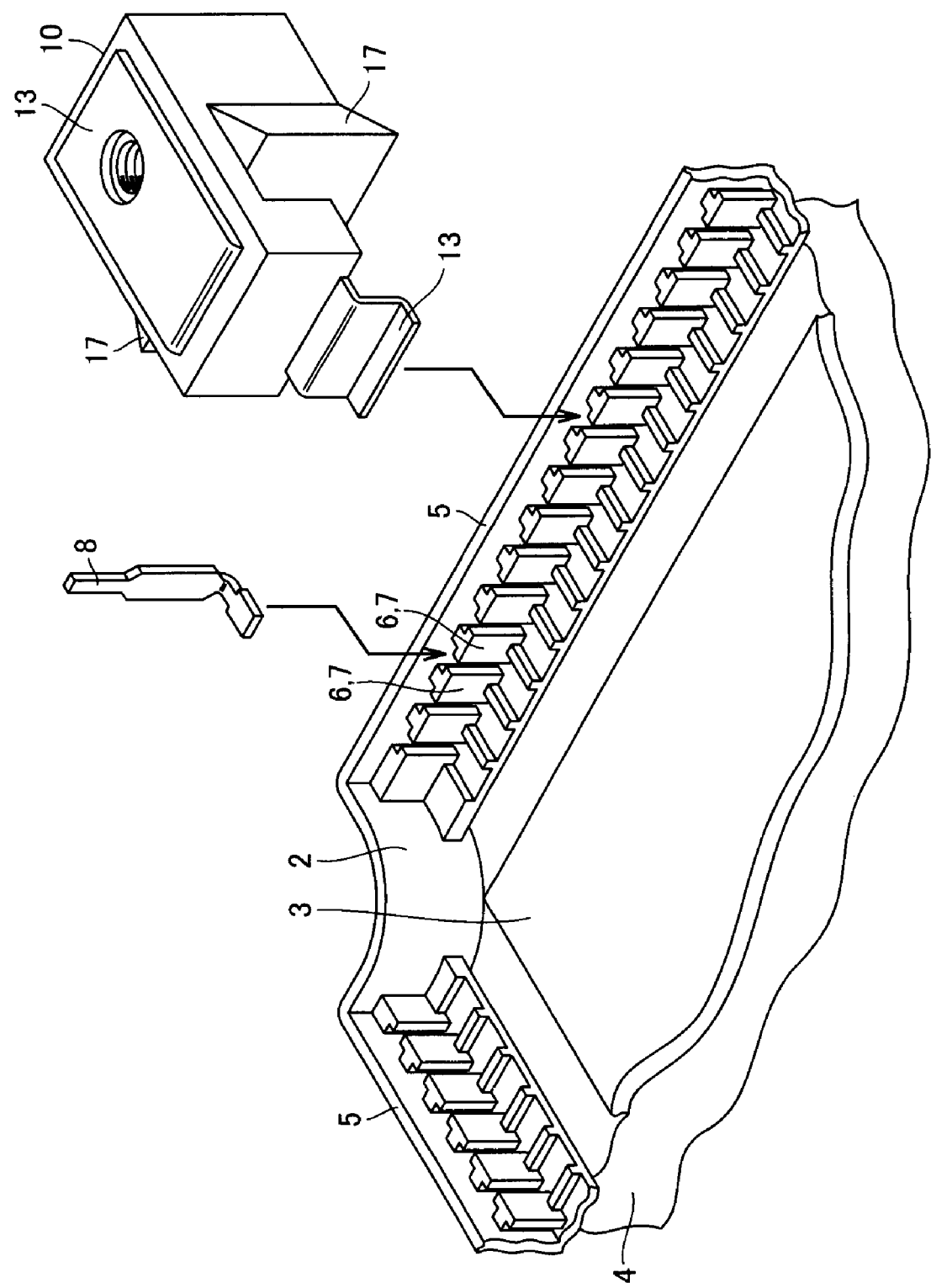
FIG. 7 is a partial perspective view of a state illustrating a manner of attaching the screw block terminal to the case member, in accordance with the embodiment.

Next, the manner how the screw block terminal 10 described above is attached to case member 2 will be described. First, as shown in FIG. 7, screw block terminal 10 is aligned to a prescribed position corresponding to the form of semiconductor device 1 in case member 2, and projection 16 (see FIG. 4 or 5) of screw block terminal 10 is inserted to the space between wall-like bodies 7, 7 of case member 2. Thus, screw block terminal 10 comes to be fixed on a prescribed position of case member 2. As to the pin terminal 8, it is inserted between two adjacent wall-like bodies 7,7 positioned at a prescribed position, whereby pin terminal 8 is fixed on case member 2.

Figure 8:
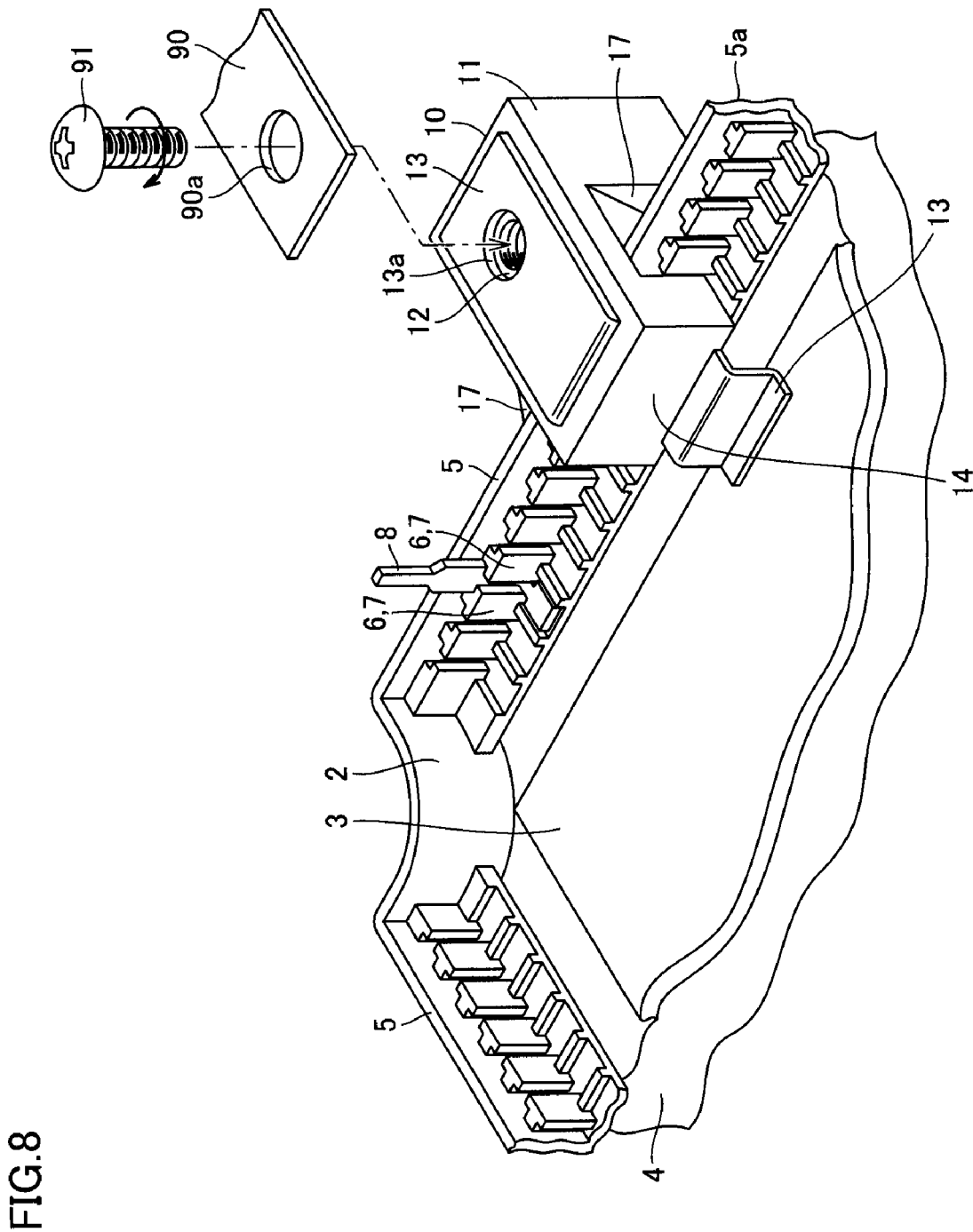
FIG. 8 is a partial perspective view showing a state following the state shown in FIG. 7, in accordance with the embodiment.
Figure 9:
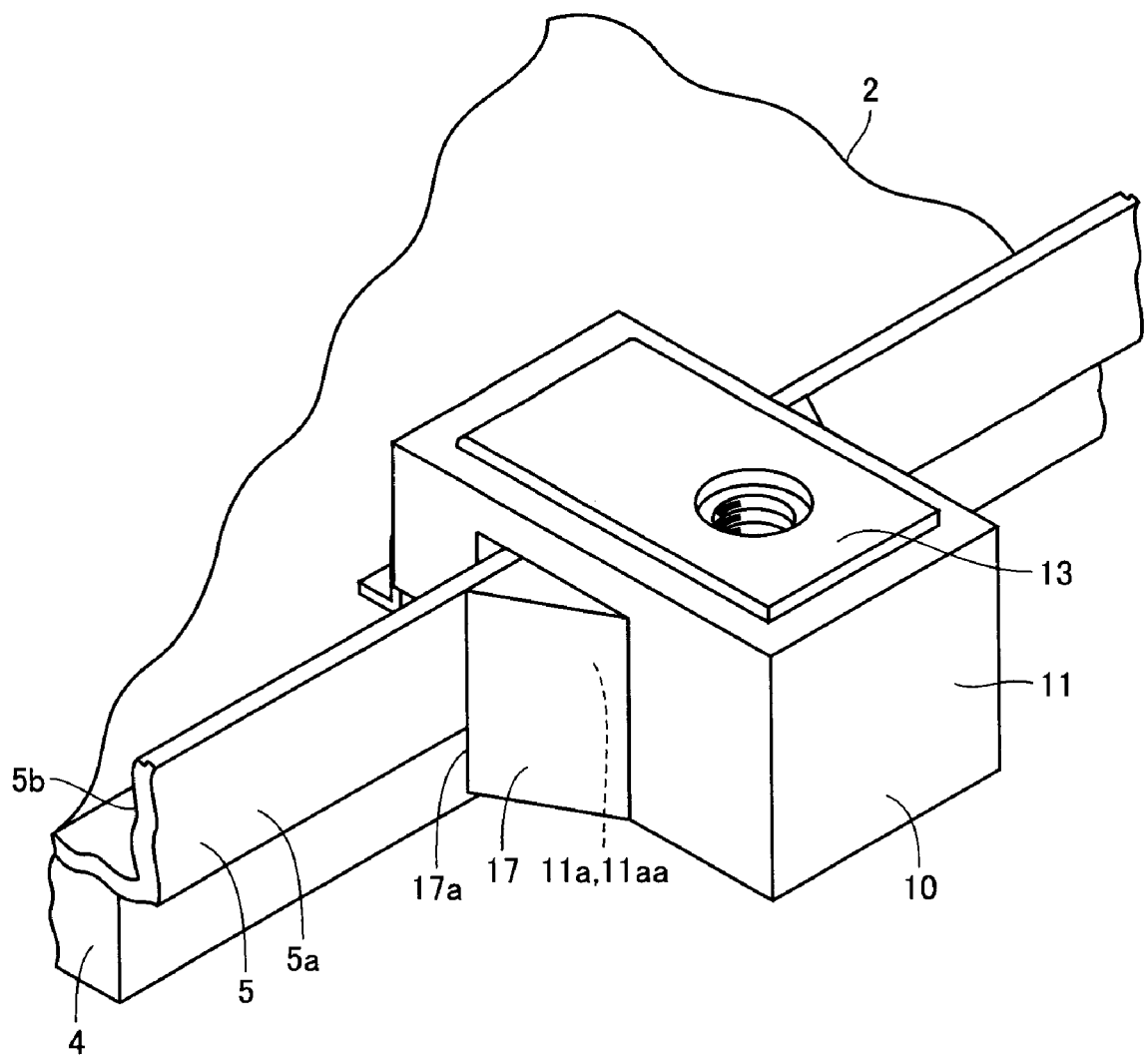
FIG. 9 is a partial perspective view showing the screw block terminal in the state shown in FIG. 8, in accordance with the embodiment.

As shown in FIG. 9, with screw block terminal 10 fixed on case member 2, the first side surface portion 11a of block body 11 is in contact with outer wall surface 5a of sidewall portion 5, and projected contact portions 17 are also in contact with outer wall surface 5a, expanding the contact area 11aa of the first side surface portion 11a. After the screw block terminal 10 is attached to the case member as shown in FIG. 8, a screw 91 is inserted through an opening 90a of a bus-bar 90, as a terminal for connection to external equipment (not shown), and screwed in nut 12, so that bus-bar 90 is connected to screw block terminal 10.

Figure 10:
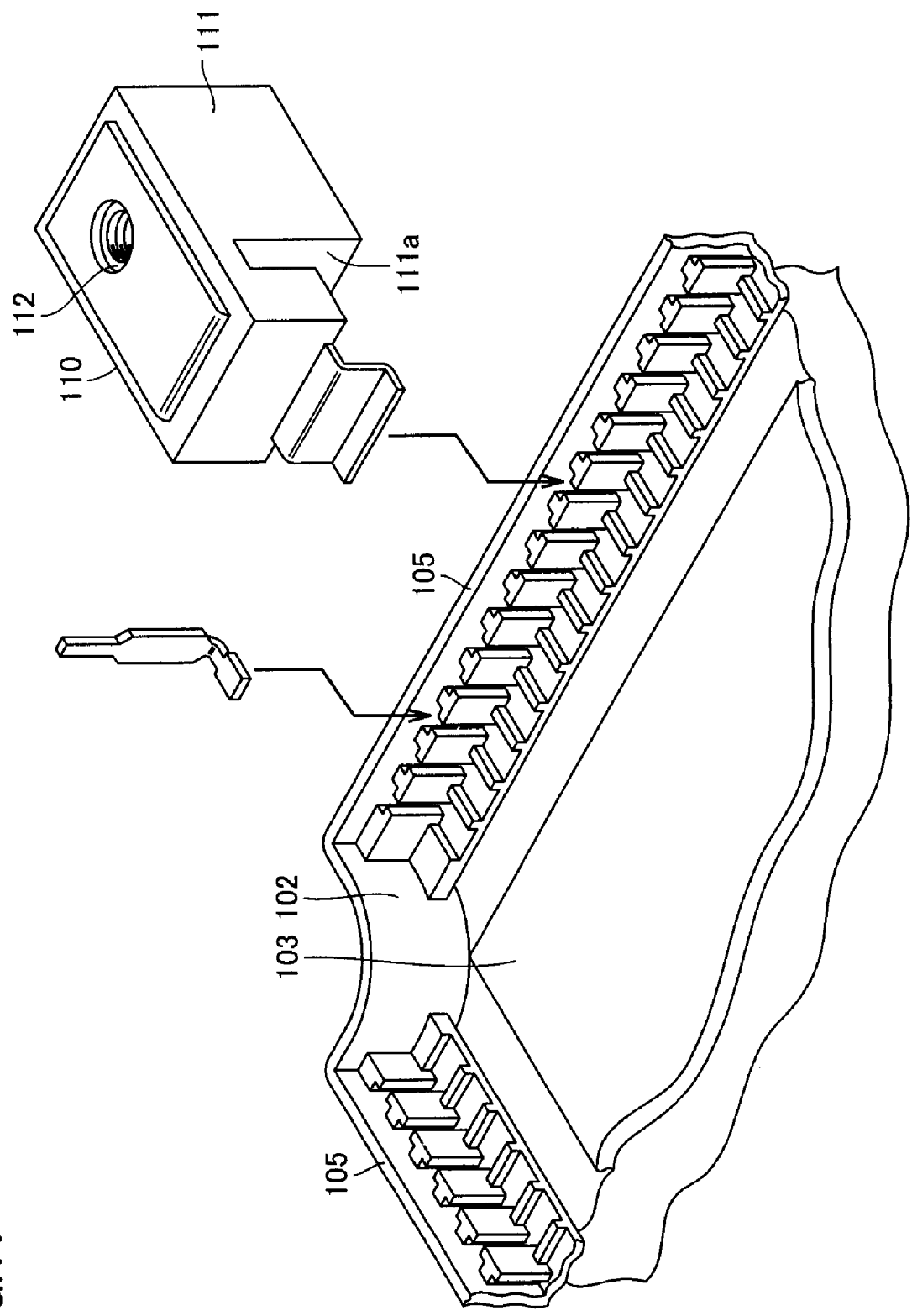
FIG. 10 is a partial perspective view of a state illustrating the manner of attaching the screw block terminal to the case member of a semiconductor device as a comparative example of the embodiment.
Figure 11:
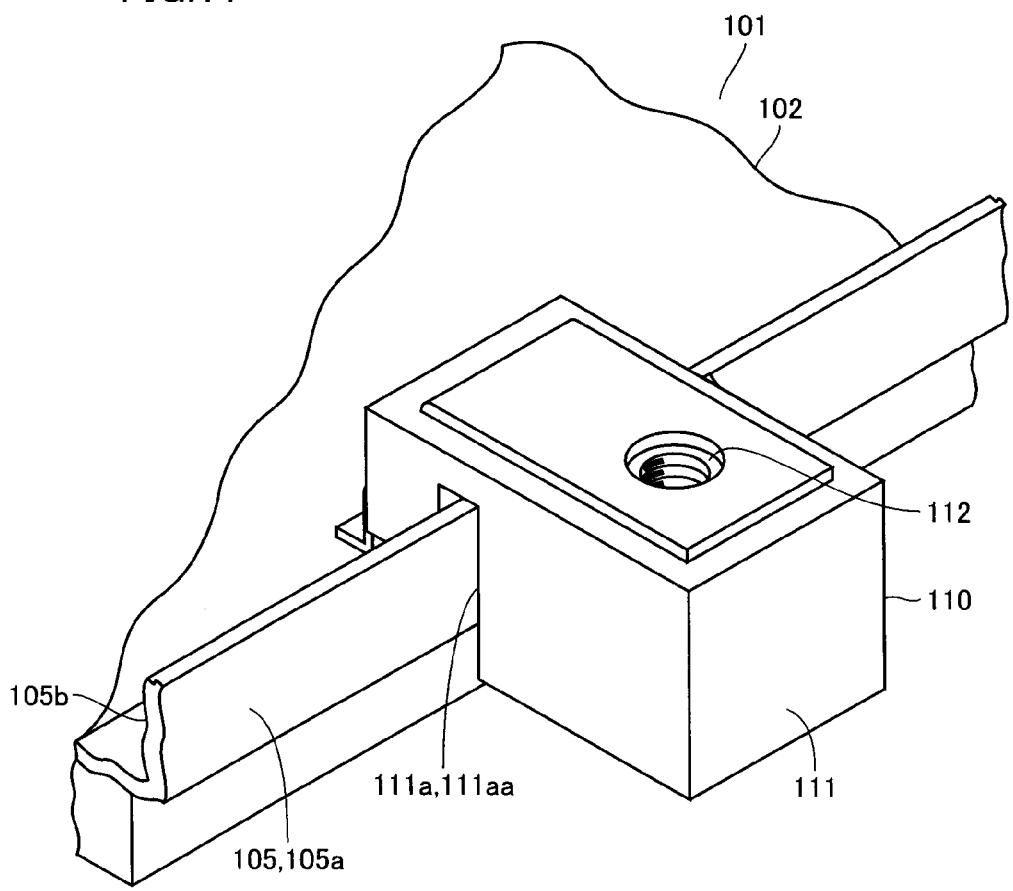
FIG. 11 is a partial perspective view showing the screw block terminal in a state following the state shown in FIG. 10, in accordance with the embodiment.

As a comparative example of the semiconductor device, one having a screw block terminal without projected contact portion will be described. Here, as shown in FIG. 10, when a screw block terminal 110 is fitted to a prescribed position of case member 102 and fixed on case member 102, only the first side surface portion 111a of block body 111 of screw block terminal 110 comes to be in contact with an outer wall surface 105a of sidewall portion 105, as shown in FIG. 11.

Figure 12:
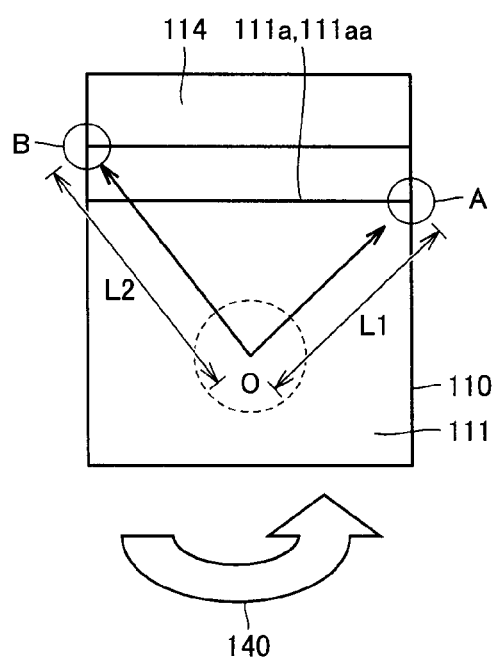
FIG. 12 is a bottom view showing a portion where stress concentrates, of the screw block terminal of the semiconductor device as a comparative example of the embodiment.
Figure 13:
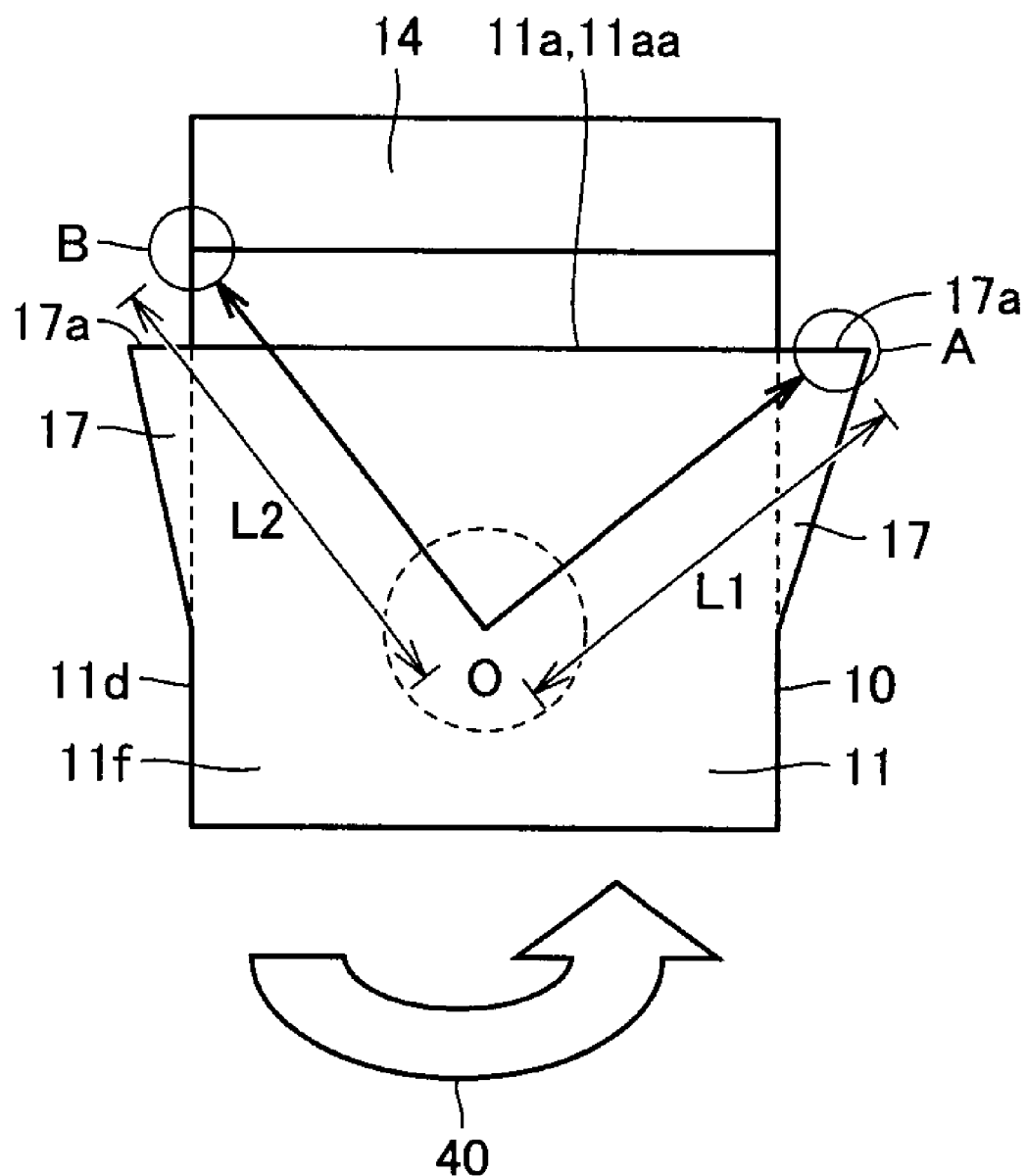
FIG. 13 is a bottom view showing a portion where stress concentrates, of the screw block terminal of the semiconductor device in accordance with the embodiment.

The amount of projection (projection length) of projected contact portion 17 of semiconductor device 1 of the present invention will be described in connection with the semiconductor device 101 of the comparative example. Referring to FIG. 12, in semiconductor device 101 of the comparative example not having the projected contact portion, when the screw is turned in the direction shown by an arrow 140 to be fastened on block body 111, stress concentrates at an end portion A of contact surface 111aa of the first side surface portion 111a that comes into contact with outer wall surface 105a (see FIG. 11) of sidewall portion 105 and at an end portion B of overhang portion 114 that comes into contact with an inner wall surface 105b (see FIG. 11) of sidewall portion 105. A distance L1 from the center O of nut 112 (see FIG. 11) to the end portion A is shorter than the distance L2 from the center O of nut 112 to the end portion B. This results in difference in stress acting on end portion A and end portion B, which difference causes a crack or the like in screw block terminal 110.

In contrast, in semiconductor device 1 of the present invention, when a screw 91 (see FIG. 8) is turned in the direction shown by an arrow 40 to be fastened on block body 11, stress concentrates at an end portion A of contact surface 17a of projected contact portion 17 that is brought into contact with outer wall surface 5a of sidewall portion 5 and at an end portion B of overhang portion 14 that is brought into contact with inner wall surface 5b of sidewall portion 5. Projected contact portions 17 are formed to protrude from the third and fourth side surface portions 11c and 11d such that the distance L1 from the center O of nut 12 to the end portion A becomes equal to the distance L2 from the center O of nut 12 to the end portion B. As a result, the stress acting on end portion A becomes approximately equal to the stress acting on end portion B, and hence, stress is balanced, and local concentration of stress to a specific portion of screw block terminal 10 can be prevented.

In semiconductor device 1 described above, projected contact portion 17 is formed as a stress relaxing portion of screw block terminal 10. Therefore, compared with semiconductor device 101 (see FIG. 11) of the comparative example having screw block terminal 110 without any projected contact portion, in the semiconductor device 1 of the present invention, when screw block terminal 10 is fixed on case member 2, in addition to the first side surface portion 11a, two projected contact portions 17 are brought into contact with outer wall surface 5a of sidewall portion 5 (see FIG. 9).

Accordingly, as the contact surface of block body 11 in contact with outer wall surface 5a of sidewall portion 5, contact surfaces 17a are added to contact surface 11aa, and the contact area increases. As a result, fastening stress (rotational stress) generated in block body 11 along with the operation of tightening the screw is dispersed, and local stress acting on a specific portion of screw block terminal 10 can be prevented. Further, as the amount of projection of projected contact portions 17 is set such that the distance L1 from the center O of nut 12 to the end portion A and the distance L2 from the center O of nut 12 to the end portion B becomes equal to each other, the stress acting on end portion A becomes approximately the same as the stress acting on end portion B and is balanced. As a result, it becomes possible to tighten the screw in screw block terminal 10 with higher fastening torque and to improve resistance to fastening torque.

Embodiment 2

As described above, in semiconductor device 10, a plurality of screw block terminals 10 may be attached to case member 2 in accordance with the form (see FIG. 1). In Embodiment 2, a semiconductor device will be described, in which block bodies 11 of two neighboring screw block terminals 10 among the plurality of screw block terminals 10 are fixed to each other by a prescribed connection fixing member 30.

Figure 14:
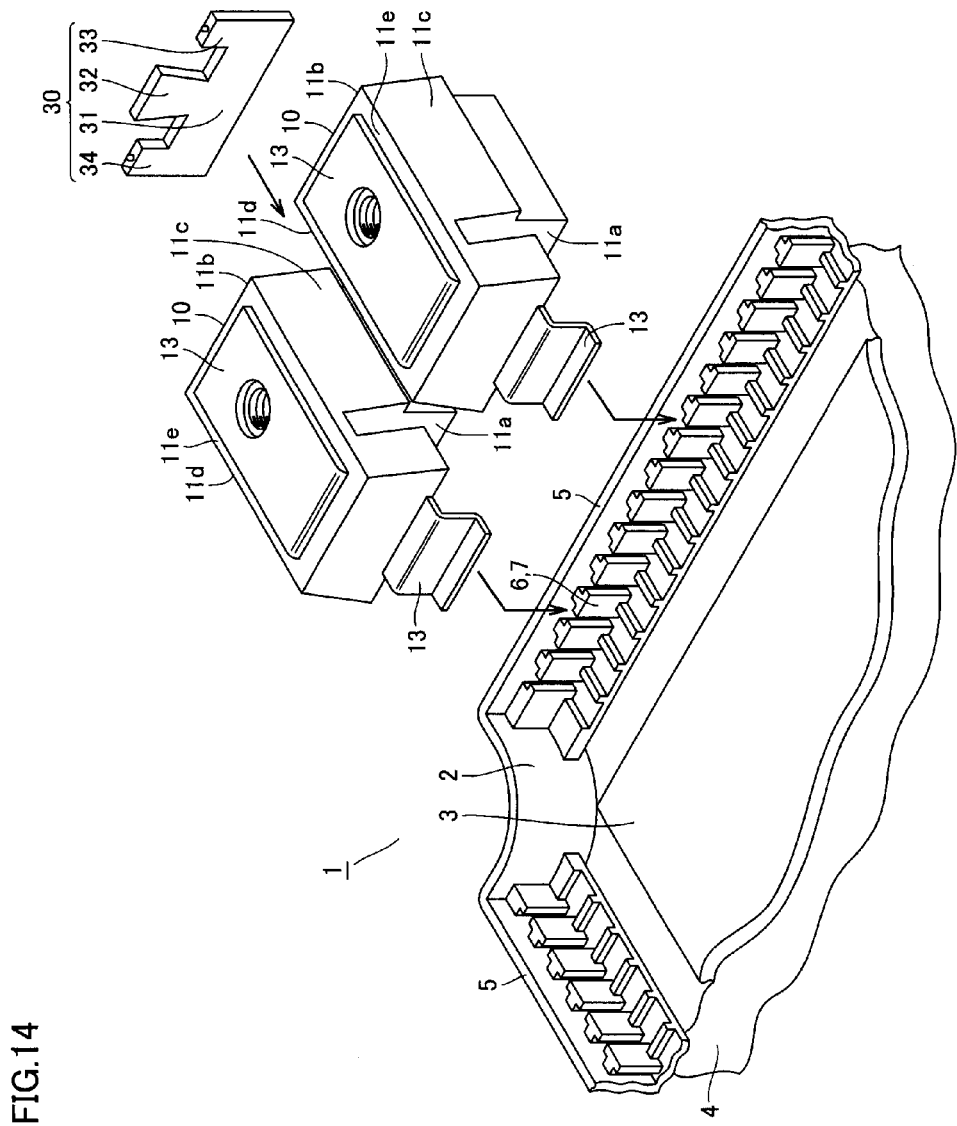
FIG. 14 is a partial perspective view of a semiconductor device in accordance with Embodiment 2.
Figure 15:
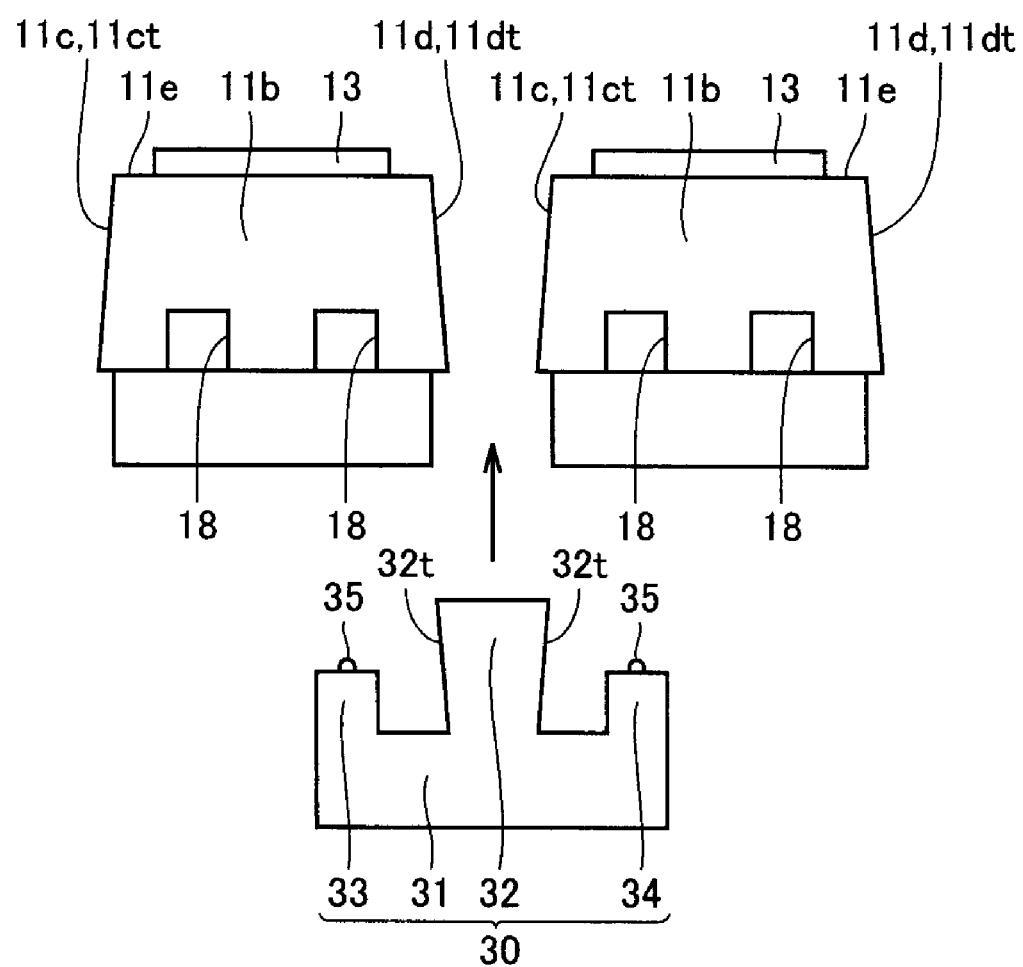
FIG. 15 is a rear view showing a connection fixing member and the screw block terminal of the semiconductor device in accordance with the embodiment.

As shown in FIGS. 14 and 15, first, screw block terminal 10 has tapers 11ct and 11dt on the third and fourth side surface portions 11c and 11d of block body 11, having the width gradually widened downward from the top surface portion 11e of block body 11. Therefore, when two screw block terminals 10 are placed next to each other, it follows that the fourth side surface portion 11d of block body 11 of one screw block terminal 10 gradually comes closer to the third side surface portion 11c of block body 11 of the other screw block terminal 10. Further, on the second side surface portion 11b of each block body 11, two trenches 18 are formed at prescribed positions.

Connection fixing member 30 is formed to have a bridge portion 31 spanning across mutually adjacent two block bodies 11, and first, second and third projecting portions 32, 33, and 34. The first projecting portion 32 is provided projected at the central portion of bridge portion 31 and has tapers 32t having the width gradually narrowing from the tip end portion to the root on bridge portion 31, so that the first projected portion 32 is fit in the region between the fourth side surface portion 11d of one block body 11 and the third side surface portion 11c of the other block body 11. Specifically, the first projecting portion 32 has inversely tapered shape.

The second projecting portion 33 is formed projected from one end side of bridge portion 31, such that a portion of one block body 11 is pinched by the first and second projecting portions 32 and 33, when the second projecting portion 33 is fit in the trench 18. The third projecting portion 34 is formed projected from the other end side of bridge portion 31, such that a portion of one block body 11 is pinched by the first and third projecting portions 32 and 34, when the third projecting portion 34 is fit in the trench 18. Each of the second and third projecting portions 33 and 34 further has a projection 35 on the upper end portion.

Figure 16:
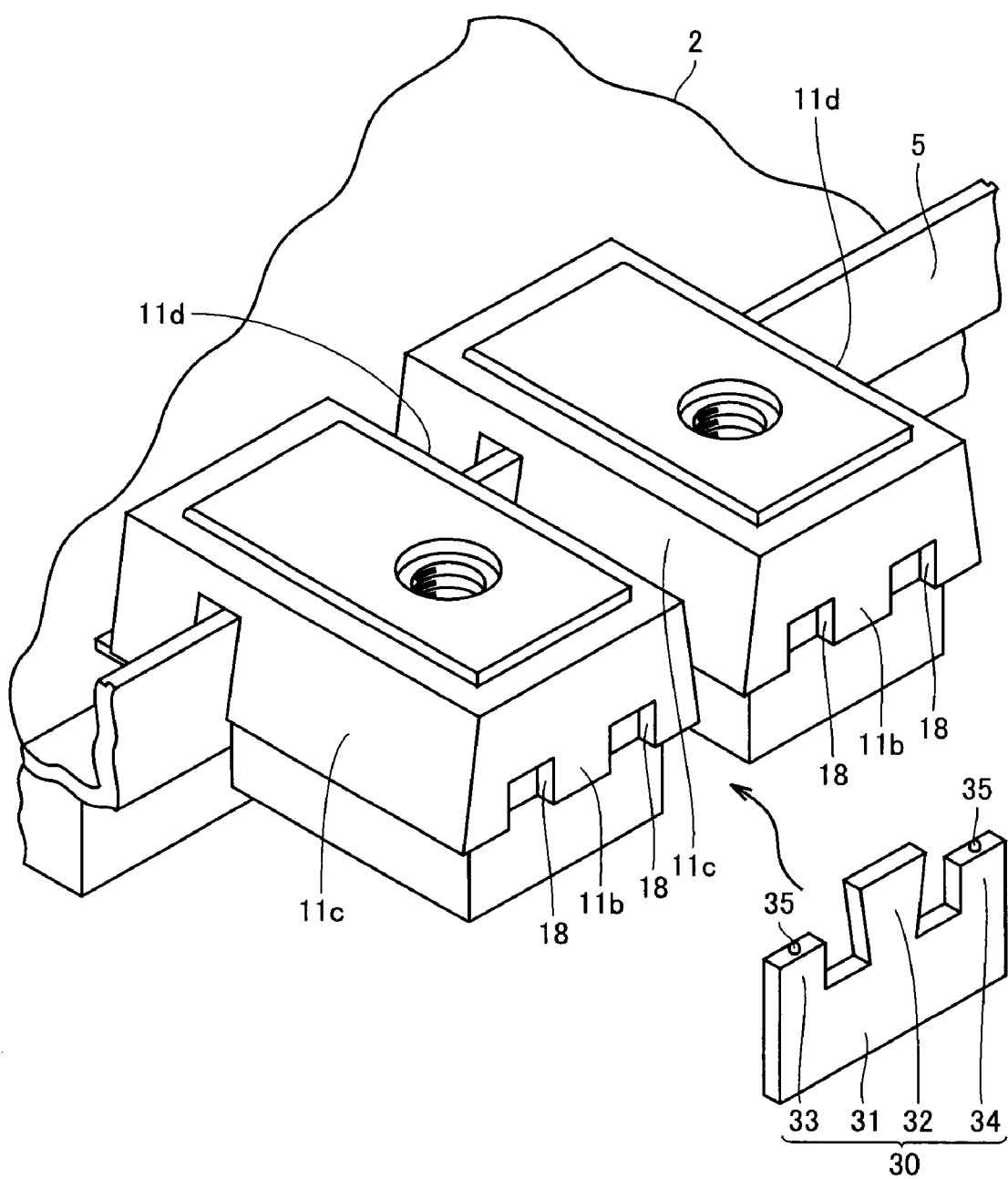
FIG. 16 is a partial perspective view of a state illustrating the manner of attaching the screw block terminal to the case member in accordance with the embodiment.
Figure 17:
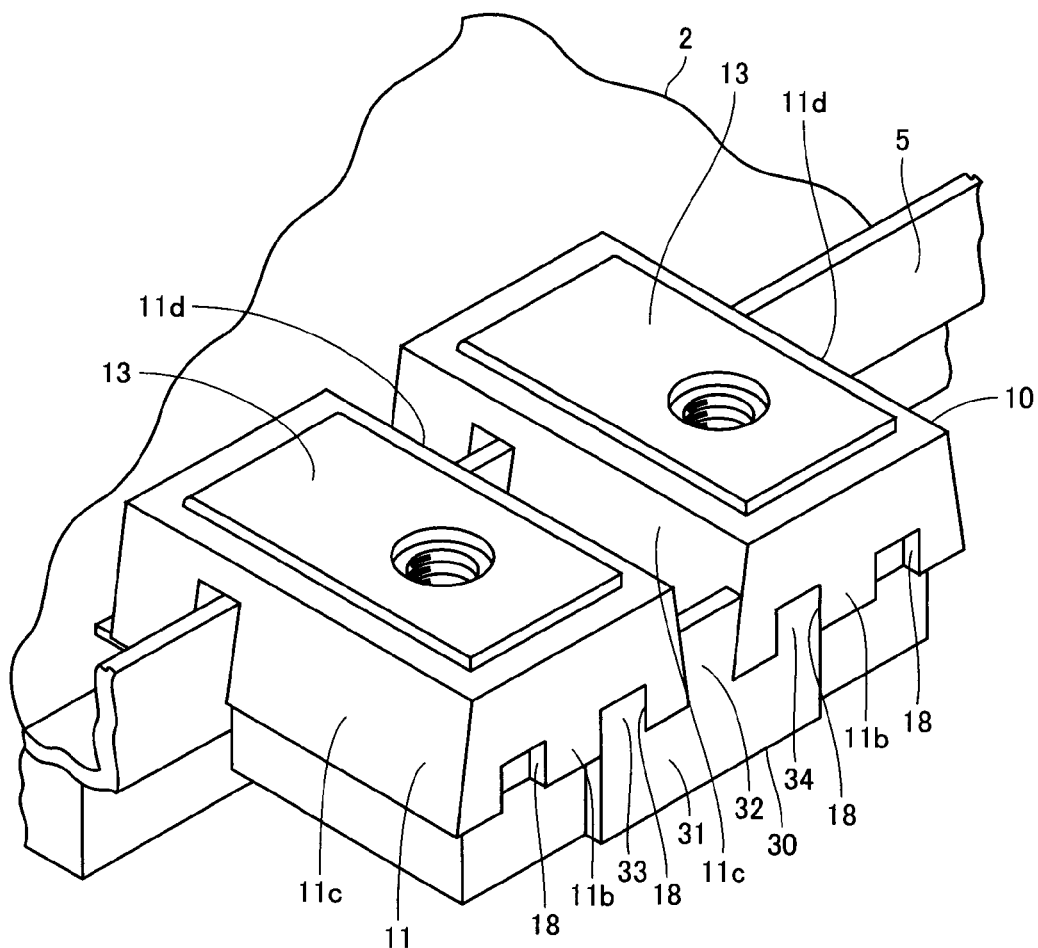
FIG. 17 is a partial perspective view showing a state following the state shown in FIG. 16, in accordance with the embodiment.

Next, the manner how screw block terminal 10 described above is attached to case member 2 will be described. First, as shown in FIG. 14, screw block terminals 10 are aligned at prescribed positions of case member 2 corresponding to the form of the semiconductor device, and projections 16 (see FIG. 4 or the like) of screw block terminals 10 are fitted into the spaces between wall-like bodies 7, 7 of case member 2. Thus, screw block terminals 10 are attached to prescribed positions of case member 2, as shown in FIG. 16.

Next, with adjacent two screw block terminals 10 attached on case member 2, the two screw block terminals 10 are fixed to each other, by means of connection fixing member 30. Specifically, the first projecting portion 32 is inserted to the region between the fourth side surface portion 11d of one block body 11 and the third side surface portion 11c of the other block body 11, the second projecting portion 33 is inserted to trench 18 of one block body 11 and the third projecting portion 34 is inserted to trench 18 of the other block body 11.

Consequently, a portion of one block body 11 is pinched between the first and second projecting portions 32 and 33, and a portion of the other block body 11 is pinched between the first and third projecting portions 32 and 34, so that the two screw block terminals 10 are fixed to each other.

In semiconductor device 1 described above, among a plurality of screw block terminals 10, two adjacent screw block terminals 10 are fixed to each other by connection fixing member 30. Specifically, for one screw block terminal 10 of the two adjacent screw block terminals 10, the other screw block terminal fixed thereon by connection fixing member 30 serves as the stress relaxing portion.

Therefore, in an operation of fastening a screw on one screw block terminal 10, the fastening stress (rotational stress) generated in its block body 11 is dispersed to the other screw block terminal 10 through connection fixing means 30, and thus, local action of stress on a specific portion of the screw block terminal 10 can be prevented. As a result, it becomes possible to tighten the screw with higher fastening torque and to improve resistance to fastening torque.

Figure 18:
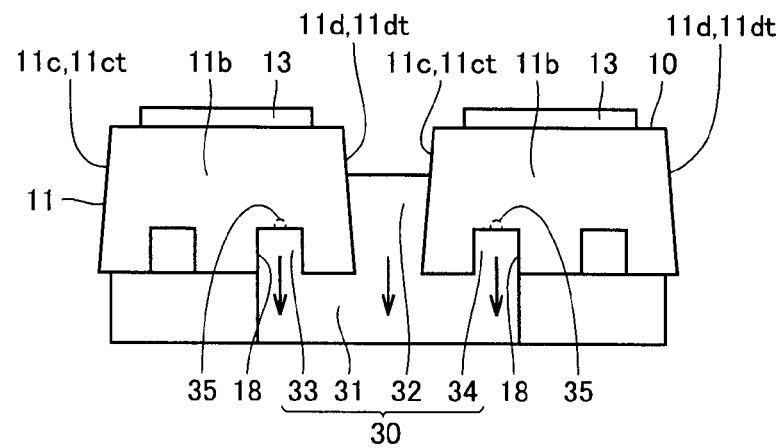
FIG. 18 is a rear view of the screw block terminal in the state shown in FIG. 17, in accordance with the embodiment.

Further, as the first projecting portion 32 of connection fixing member 30 is inversely tapered, slipping of connection fixing member 30 can be prevented. Further, as the second and third projecting portions 33 and 34 each has a projection 35 at the upper end portion, connection fixing member 30 receives a downward force (see an arrow in FIG. 18) when the second and third projecting portions 33 and 34 are respectively fitted in trenches 18, so that the inversely tapered first projecting portion 32 is more firmly fitted between the one and the other block bodies 11, and the fastening stress can more reliably be relaxed.

Embodiment 3

Figure 19:
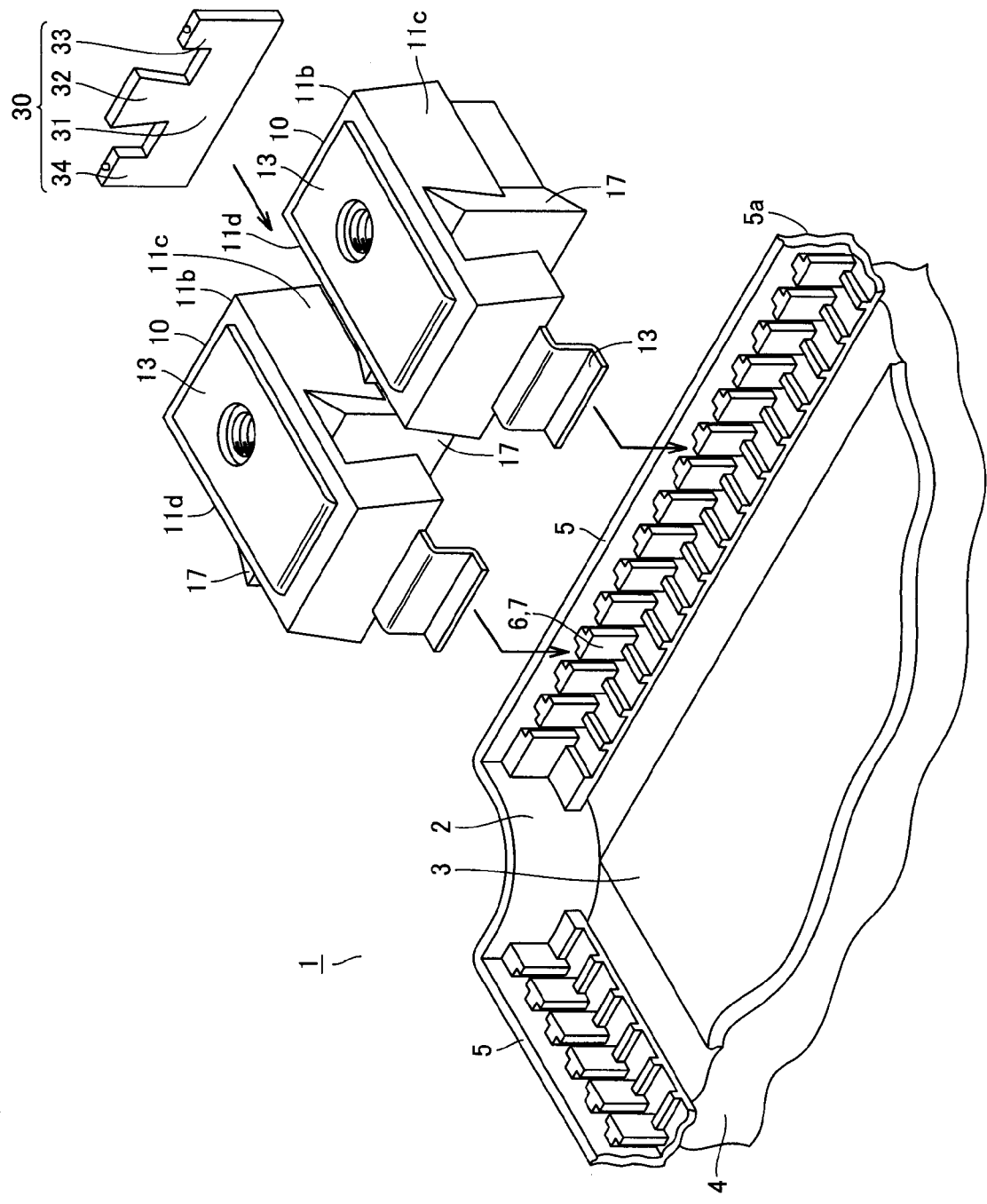
FIG. 19 is a partial perspective view of a semiconductor device in accordance with Embodiment 3 of the present invention.

In Embodiment 3, a semiconductor device including both the projected contact portion and the connection fixing member described in the embodiments above will be described. Referring to FIG. 19, in semiconductor device 1, on the third and fourth side surface portions 11c and 11d of block body 11 of each of the screw block terminals 10, projected contact portions 17 are formed, to enlarge the area to be in contact with the outer wall surface 5a of sidewall portion 5. Further, the third and fourth side surface portions 11c and 11d of block body 11 are tapered, and trenches 18 (see FIG. 20) are formed in the second side surface portion 11b. With the block body 11 having such a shape, connection fixing member 30 is provided, for connecting and fixing the block bodies 11 of two adjacent screw block terminals 10 to each other.

The manner of attaching the screw block terminals 10 on case member 2 is as described above. First, screw block terminals 10 are fixed at prescribed positions of case member 2. Then, the first projecting portion 32 of connection fixing member 30 is inserted to the region between the fourth side surface portion 11d and the third side surface portion 11c, and the second and third projecting portions 33 and 34 are inserted to corresponding trenches 18, respectively, whereby the two adjacent screw block terminals 10 are connected and fixed on each other by connection fixing member 30.

Figure 20:
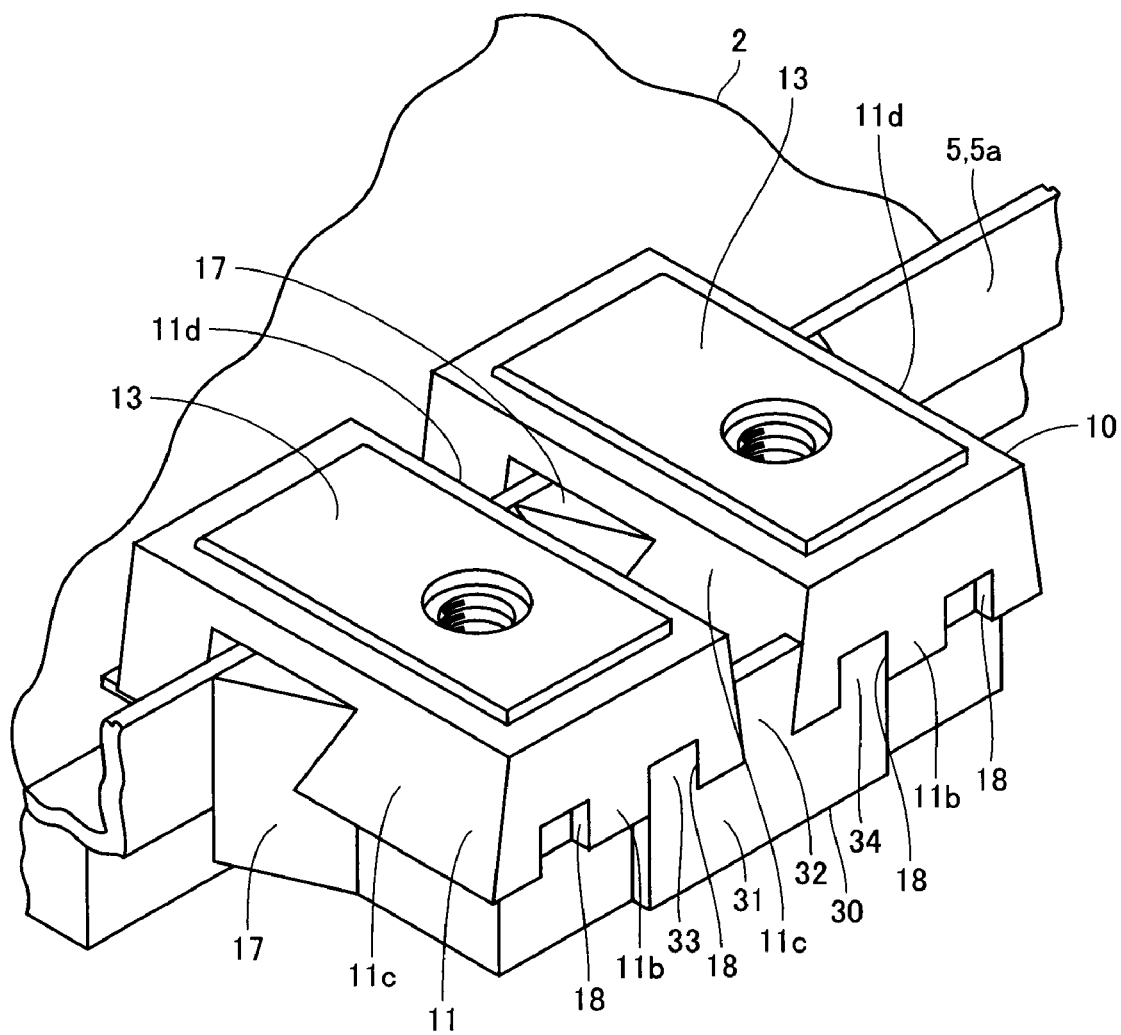
FIG. 20 is a partial perspective view showing the screw block terminal attached to the case member, in accordance with the embodiment.

As shown in FIG. 20, with screw block terminals 10 fixed on case member 2, each block body 11 has the first side surface portion 11a as well as the two projected contact portions 17 come to be in contact with the outer wall surface 5a of sidewall portion 5. Further, mutually adjacent two screw block terminals 10 are fixed to each other by connection fixing member 30.

In semiconductor device 1 described above, in an operation of fastening a screw, the fastening stress (rotational stress) generated in block body 11 is dispersed to the contact surface 11aa of the first side surface portion 11a and to the contact surfaces 17a of projected contact portions 17, as well as to the other screw block terminal 10 through connection fixing means 30, and therefore, local action of stress on a specific portion of the screw block terminal 10 can be prevented. As a result, it becomes possible to tighten the screw with higher fastening torque and to improve resistance to fastening torque.

Embodiment 4

Figure 21:
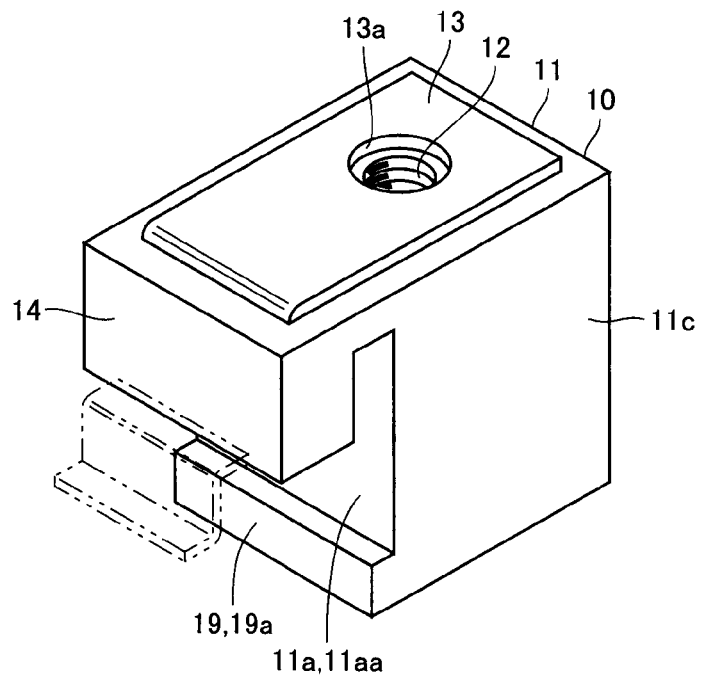
FIG. 21 is a perspective view showing the screw block terminal in accordance with Embodiment 4 of the present invention.

A semiconductor device in accordance with Embodiment 4 of the present invention will be described. As can be seen from FIG. 21, in this embodiment, first, a base plate contact portion 19 to be in contact with base plate 4 (see FIG. 2) of the case member is formed on the first side surface portion 11a of block body 11 of screw block terminal 10. Base plate contact portion 19 is formed integrally when block body 11 is resin-molded. Except for this point, the structure is the same as that of screw block terminal shown in FIG. 3 or the like, and therefore, corresponding portions are denoted by the same reference characters and description thereof will not be repeated.

Figure 22:
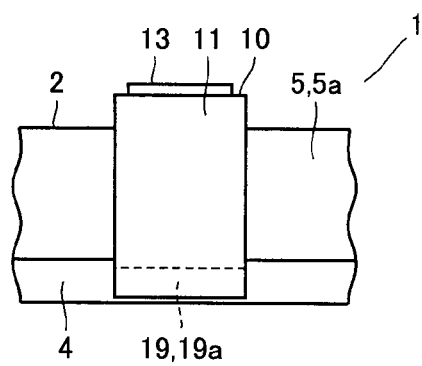
FIG. 22 is a rear view showing the screw block terminal attached to the case member, in accordance with the embodiment.
Figure 23:
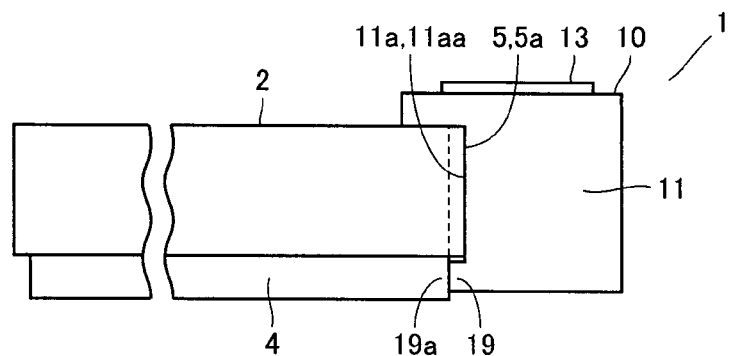
FIG. 23 is a side view showing the screw block terminal attached to the case member, in accordance with the embodiment.
Figure 24:
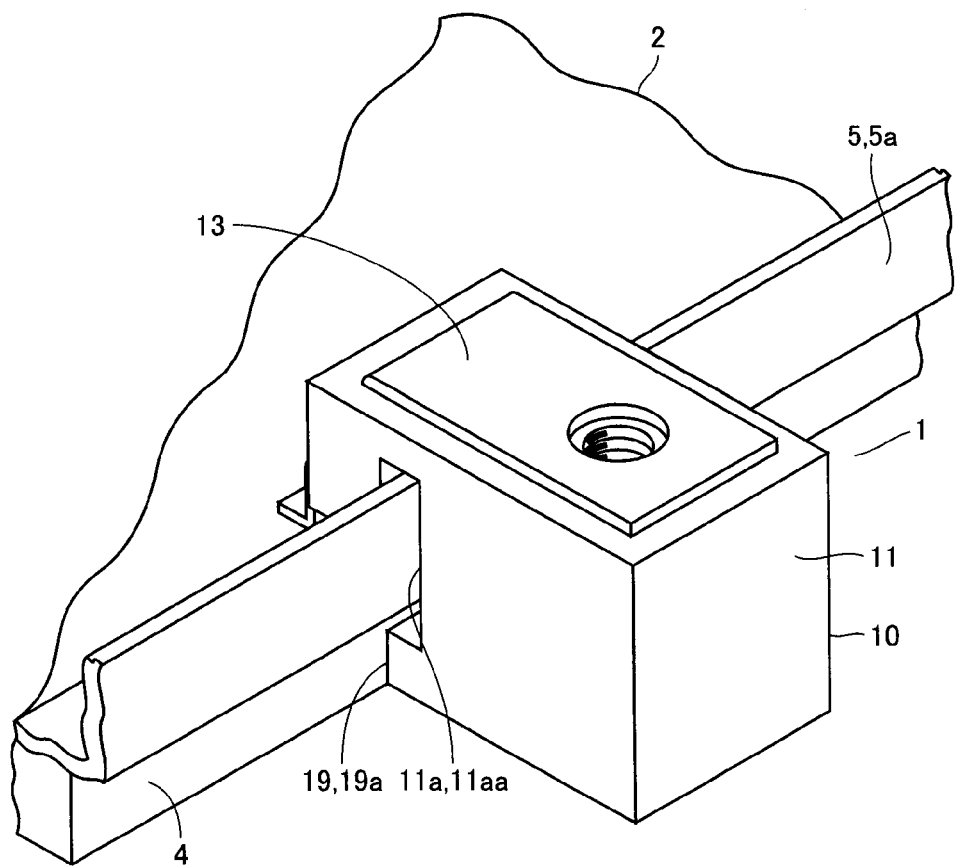
FIG. 24 is a partial perspective view showing the screw block terminal attached to the case member, in accordance with the embodiment.

The manner of attaching screw block terminal 10 on case member 2 is the same as that described in connection with Embodiment 1. Screw block terminal 10 is aligned at a prescribed position of case member 2 corresponding to the form of the semiconductor device 1, and projection 16 of screw block terminal 10 is fitted into the space between wall-like bodies 7, 7 of case member 2 (see, for example, FIG. 4). Thus, screw block terminal 10 is attached to the prescribed position of case member 2, as shown in FIGS. 22 and 23.

In semiconductor device 1 described above, base plate contact portion 19 is provided as the stress relaxing portion of screw block terminal 10. Therefore, as compared with the screw block terminal 10 not having such a base plate contact portion (see, for example, FIG. 11), not only the first side surface portion 11a but also the base plate contact portion 19 come into contact with outer wall surface 5a of sidewall portion 5, when screw block terminal 10 is fixed on case member 2.

Therefore, as the contact surface of block body 11 in contact with outer wall surface 5a of sidewall portion 5, the contact surface 19a of base plate contact portion 19 is added to contact surface 11*aa*, so that the contact area increases, and in an operation of fastening a screw, the fastening stress (rotational stress) generated in block body 11 is dispersed. Thus, local action of stress on a specific portion of the screw block terminal 10 can be prevented. As a result, it becomes possible to tighten the screw in screw block terminal 10 with higher fastening torque and to improve resistance to fastening torque.

Embodiment 5

Figure 25:
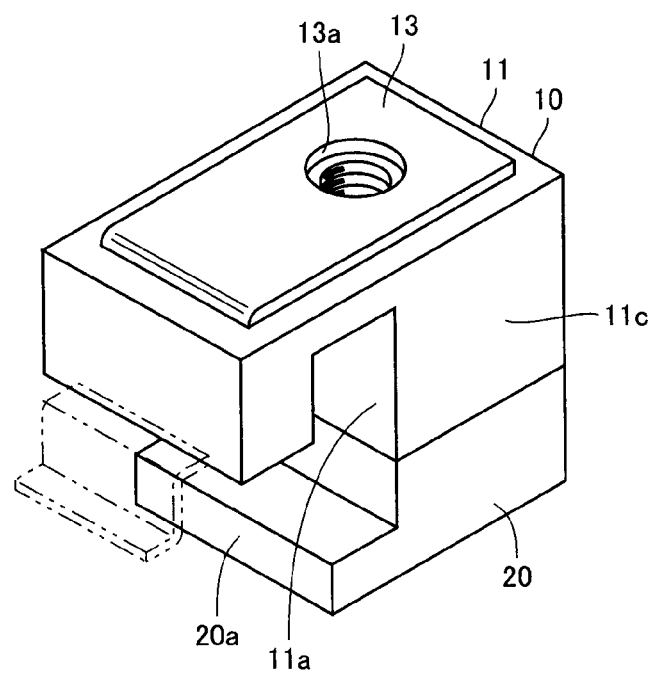
FIG. 25 is a perspective view showing the screw block terminal of the semiconductor device in accordance with Embodiment 5 of the present invention.

A semiconductor device in accordance with Embodiment 5 of the present invention will be described. As shown in FIG. 25, in the semiconductor device, block body 11 of screw block terminal 10 has a base plate contact portion 20 to be in contact with a side portion of base plate 4 (see FIG. 2 or the like) of the case member. Different from base plate contact portion 19 integrally formed by resin molding described above, base plate contact portion 20 is formed of metal such as stainless steel, and attached to a lower end of a portion formed of resin of block body 11.

Figure 27:
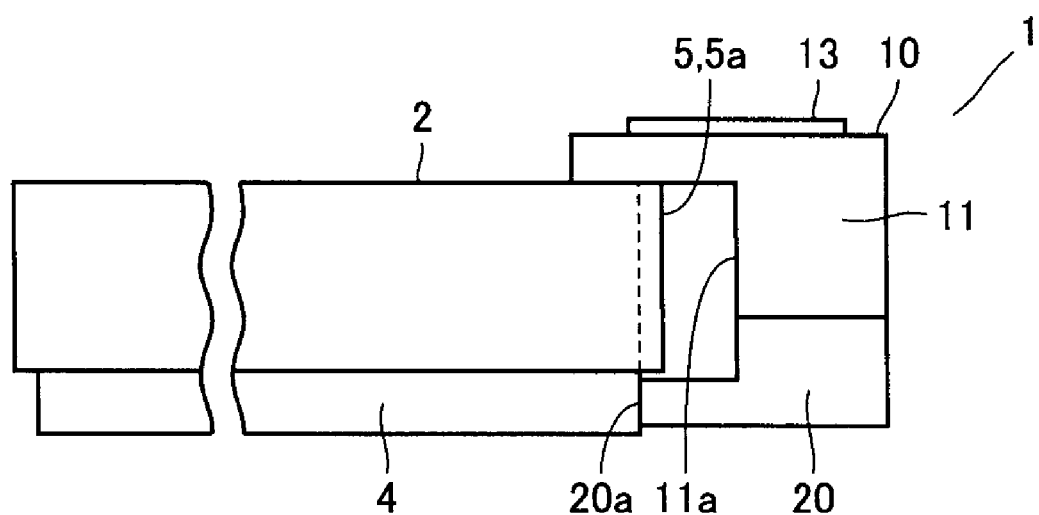
FIG. 27 is a side view showing the screw block terminal attached to the case member, in accordance with the embodiment.

Further, the first side surface portion 11*a* of block body 11 is formed recessed from outer wall surface 5*a* to be not in contact with outer wall surface 5*a* of sidewall portion 5 (see FIG. 27). Except for this point, the structure is the same as that of screw block terminal shown in FIG. 3 or the like, and therefore, corresponding portions are denoted by the same reference characters and description thereof will not be repeated.

Figure 26:
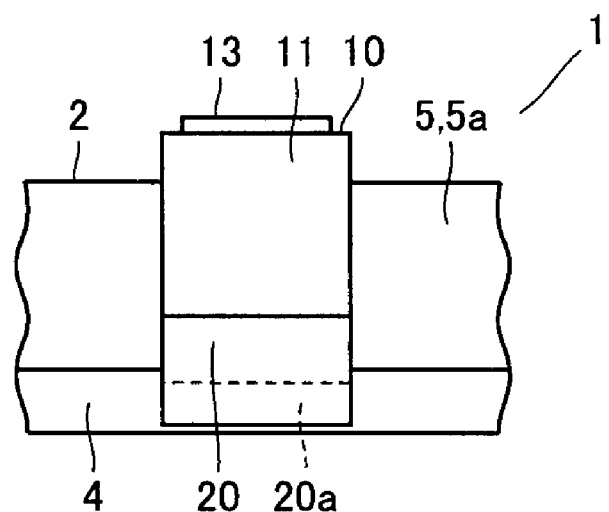
FIG. 26 is a rear view showing the screw block terminal attached to the case member, in accordance with the embodiment.

The manner of attaching screw block terminal 10 on case member 2 is the same as that described in connection with Embodiment 1. Screw block terminal 10 is aligned at a prescribed position of case member 2 corresponding to the form of the semiconductor device 1, and projection 16 of screw block terminal 10 is fitted into the space between wall-like bodies 7, 7 of case member 2 (see, for example, FIG. 4). Thus, screw block terminal 10 is attached to the prescribed position of case member 2, as shown in FIGS. 26 and 27.

Figure 28:
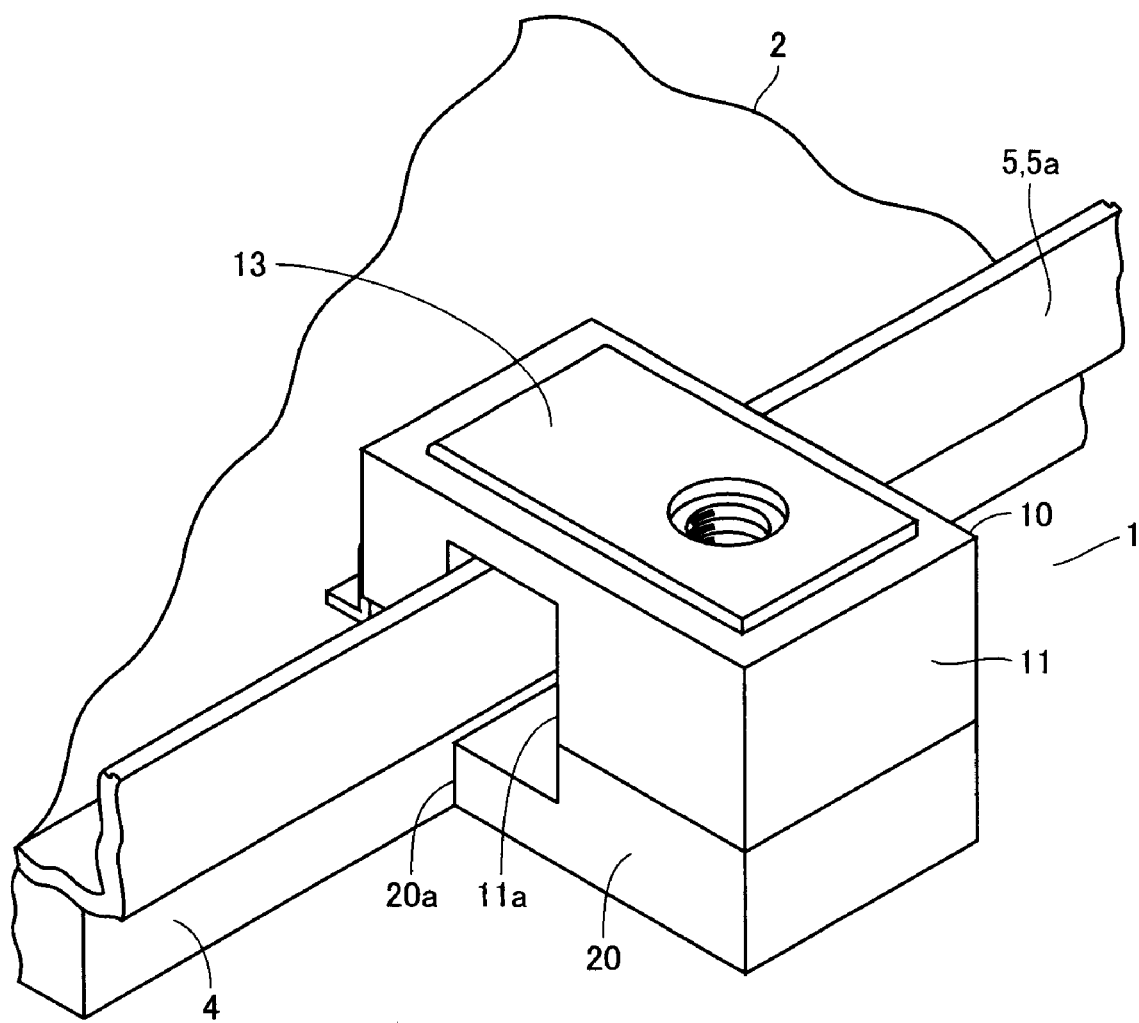
FIG. 28 is a partial perspective view showing the screw block terminal attached to the case member, in accordance with the embodiment.

In screw block terminal 10 of semiconductor device 1 described above, outer wall surface 5*a* of sidewall portion 5 is not in contact with block body 11, and base plate contact portion 20 formed of metal is in contact with the side portion of base plate 4, as shown in FIGS. 27 and 28. Generally, as the base plate 4, a copper plate having relatively high coefficient of thermal conductivity is used. Therefore, it follows that metal-to-metal contact occurs when screw block terminal 10 is fixed on case member 2. Metal-to-metal contact increases mechanical strength, resistance to fastening stress generated in block body 11 in an operation of tightening the screw is improved, and thus, resistance against fastening torque can be improved.

Further, as block body 11 formed of resin is not in contact with sidewall surface 5 of case member 2, influence of any force from block body 11 to case member 2 or from case member 2 to block body 11 can be prevented.

Embodiment 6

Figure 29:
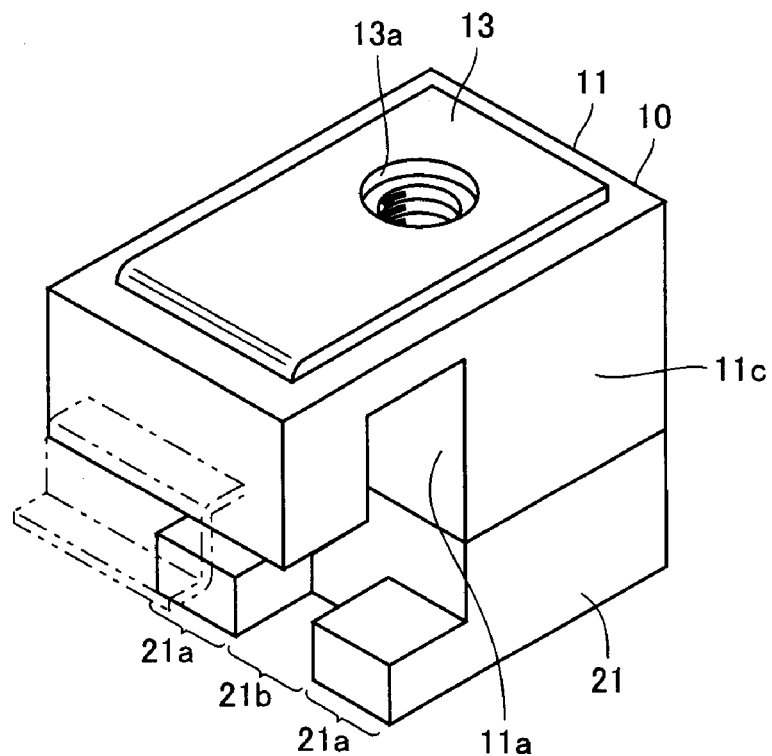
FIG. 29 is a perspective view showing the screw block terminal of the semiconductor device in accordance with Embodiment 6 of the present invention.

A semiconductor device in accordance with Embodiment 6 of the present embodiment will be described. Referring to FIG. 29, in the semiconductor device, block body 11 of screw block terminal 10 includes a base plate contact portion 21 formed of metal, to be in contact with a side portion of base plate 4 (see FIG. 2 or the like) of the case member. Base plate contact portion 21 has protrusions and recesses 21*a*, 21*b*. Correspondingly, base plate 4 has protrusions and recesses 4*a*, 4*b* that fit the protrusions and recesses 21*a*, 21*b*. The pitch of protrusions and recesses 21*a*, 21*b* and 4*a*, 4*b* is the same as the pitch of the plurality of wall-like bodies 7, 7 formed on the inside of sidewall portion 5. Except for this point, the structure is the same as that of screw block terminal shown in FIG. 25, and therefore, corresponding portions are denoted by the same reference characters and description thereof will not be repeated.

Figure 30:
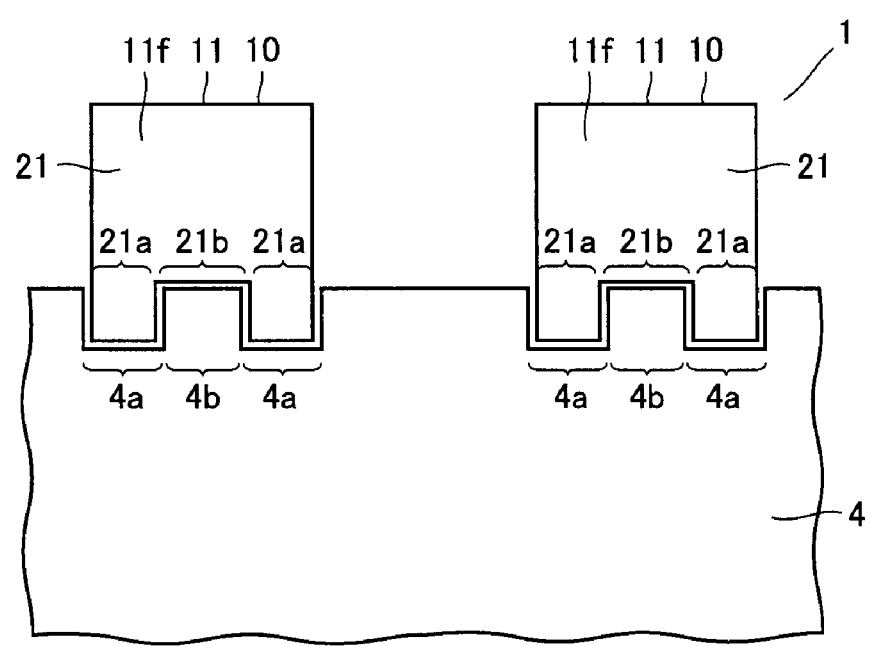
FIG. 30 is a partial bottom view showing the screw block terminal attached to the case member, in accordance with the embodiment.
Figure 31:
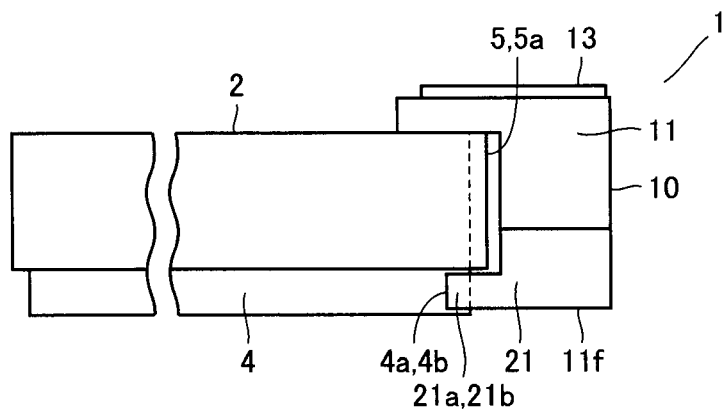
FIG. 31 is a side view showing the screw block terminal attached to the case member, in accordance with the embodiment.

The manner of attaching screw block terminal 10 on case member 2 is the same as that described in connection with Embodiment 1. Screw block terminal 10 is aligned at a prescribed position of case member 2 corresponding to the form of the semiconductor device 1, and projection 16 of screw block terminal 10 is fitted into the space between wall-like bodies 7, 7 of case member 2 (see, for example, FIG. 4), and protrusions and recesses 21*a*, 21*b* of base plate contact portion 21 are fitted in corresponding protrusions and recesses 4*a*, 4*b* of base plate 4. Thus, screw block terminal 10 is attached to the prescribed position of case member 2, as shown in FIGS. 30 and 31.

In screw block terminal 10 of semiconductor device 1 described above, base plate contact portion 21 of metal is in contact with the side portion of base plate 4. At the portion where base plate contact portion 21 and base plate 4 are in contact with each other, protrusions and recesses 21*a*, 21*b* and 4*a*, 4*b* are formed, that fit one another. Therefore, as compared with a screw block terminal not having the protrusions and recesses, metal-to-metal contact with wider contact area is established when screw block terminal 10 is fixed on case member 2. As a result, mechanical strength further increases, resistance to fastening stress generated in block body 11 in an operation of tightening the screw is improved, and thus, resistance against fastening torque can further be improved. The shape of protrusions and recesses are not limited to the rectangular shape, as long as they fit to each other.

Embodiment 7

Figure 32:
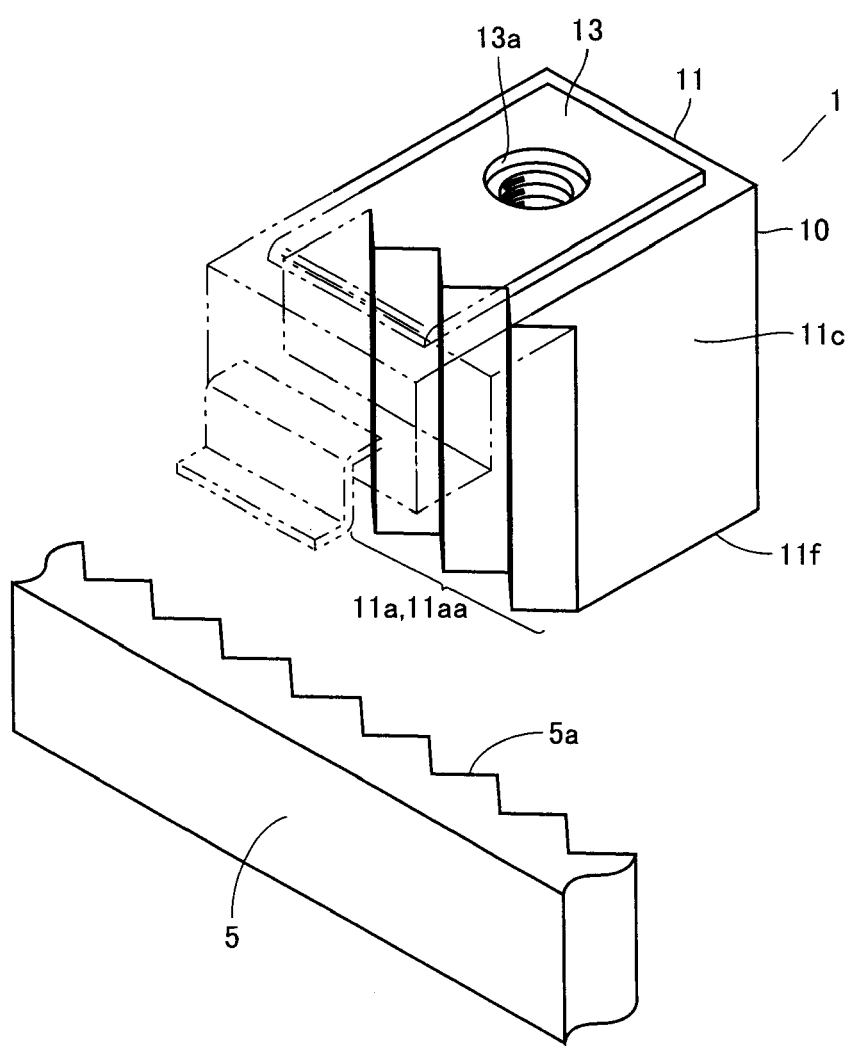
FIG. 32 is a partial perspective view showing the screw block terminal and the sidewall portion of the case member, in accordance with Embodiment 7 of the present invention.

A semiconductor device in accordance with Embodiment 7 of the present invention will be described. Referring to FIG. 32, in the semiconductor device, the first side surface portion 11*a* of block body 11 of screw block terminal 10 has protrusions and recesses in saw-tooth shape (serration). Correspondingly, outer wall surface 5*a* of sidewall portion 5 has protrusions and recesses that fit the serration. The pitch of protrusions and recesses is set as an integer multiple of the pitch of the plurality of wall-like bodies 7, 7 formed on the inside of sidewall portion 5. Except for this point, the structure is the same as that of screw block terminal shown in FIG. 3 and the like, and therefore, corresponding portions are denoted by the same reference characters and description thereof will not be repeated.

Figure 33:
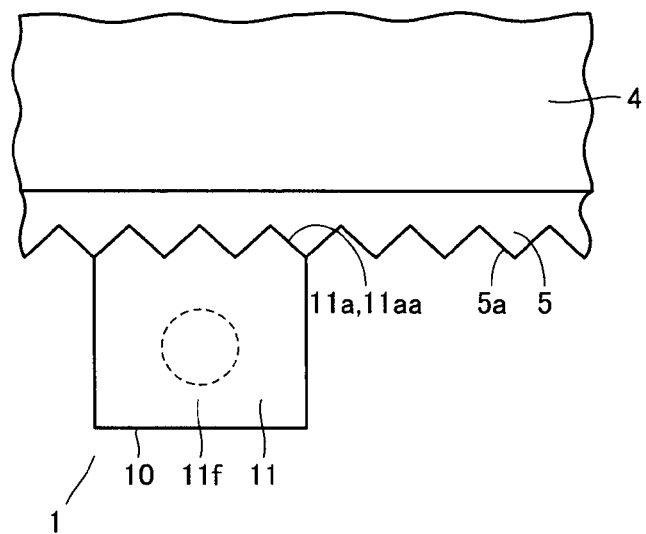
FIG. 33 is a partial bottom view showing the screw block terminal attached to the case member, in accordance with the embodiment.

The manner of attaching screw block terminal 10 on case member 2 is the same as that described in connection with Embodiment 1. Screw block terminal 10 is aligned at a prescribed position of case member 2 corresponding to the form of the semiconductor device 1, and projection 16 of screw block terminal 10 is fitted into the space between wall-like bodies 7, 7 of case member 2 (see, for example, FIG. 4), and protrusions and recesses on the first side surface portion 11*a* of block body 11 are fitted in corresponding protrusions and recesses on outer wall surface 5*a* of sidewall portion 5. Thus, screw block terminal 10 is attached to the prescribed position of case member 2, as shown in FIG. 33.

In screw block terminal 10 of semiconductor device 11 described above, at the portion where the first side surface portion 11*a* of block body 11 and outer wall portion 5*a* of sidewall portion 5 are in contact with each other, saw-tooth shaped protrusions and recesses are formed to fit to each other. Therefore, as compared with a screw block terminal not having the protrusions and recesses, contact with wider contact area is established between block body 11 and outer wall surface 5a, when screw block terminal 10 is fixed on case member 2. As a result, the stress generated in an operation of tightening the screw is dispersed, resistance to fastening stress acting on block body 11 is improved, and thus, resistance against fastening torque can be improved.

Figure 34:
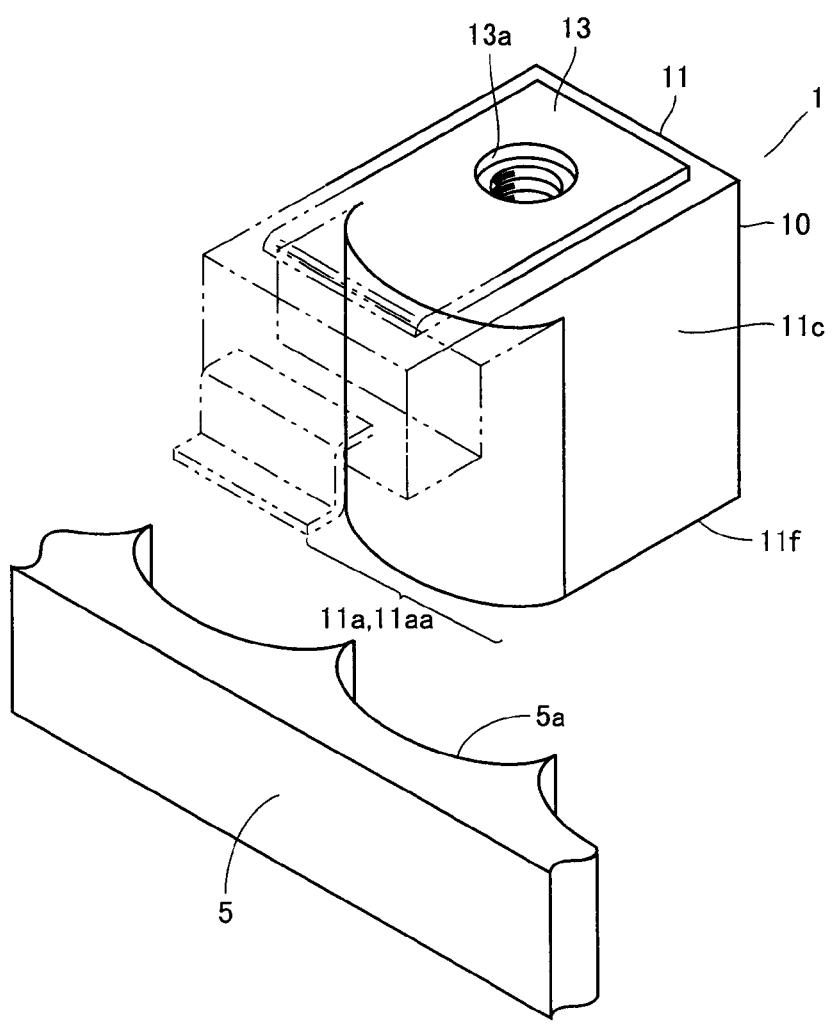
FIG. 34 is a partial perspective view showing the screw block terminal and the sidewall portion of the case member, in accordance with a modification of the embodiment.
Figure 35:
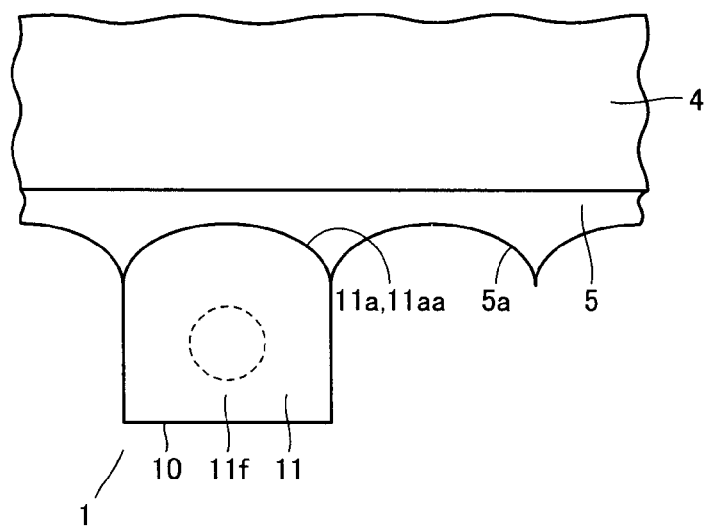
FIG. 35 is a partial bottom view showing the screw block terminal attached to the case member, in accordance with the modification of the embodiment.

The shape of protrusions and recesses on the first side surface portion 11a and outer wall surface 5a is not limited to the saw-tooth shape, and it may be rounded as shown in FIG. 34. In this case also, contact with wider contact area is established between block body 11 and outer wall surface 5a, when screw block terminal 10 is fixed on case member 2. As a result, the stress generated in an operation of tightening the screw is dispersed, resistance to fastening stress acting on block body 11 is improved, and thus, resistance against fastening torque can be improved.

Figure 36:
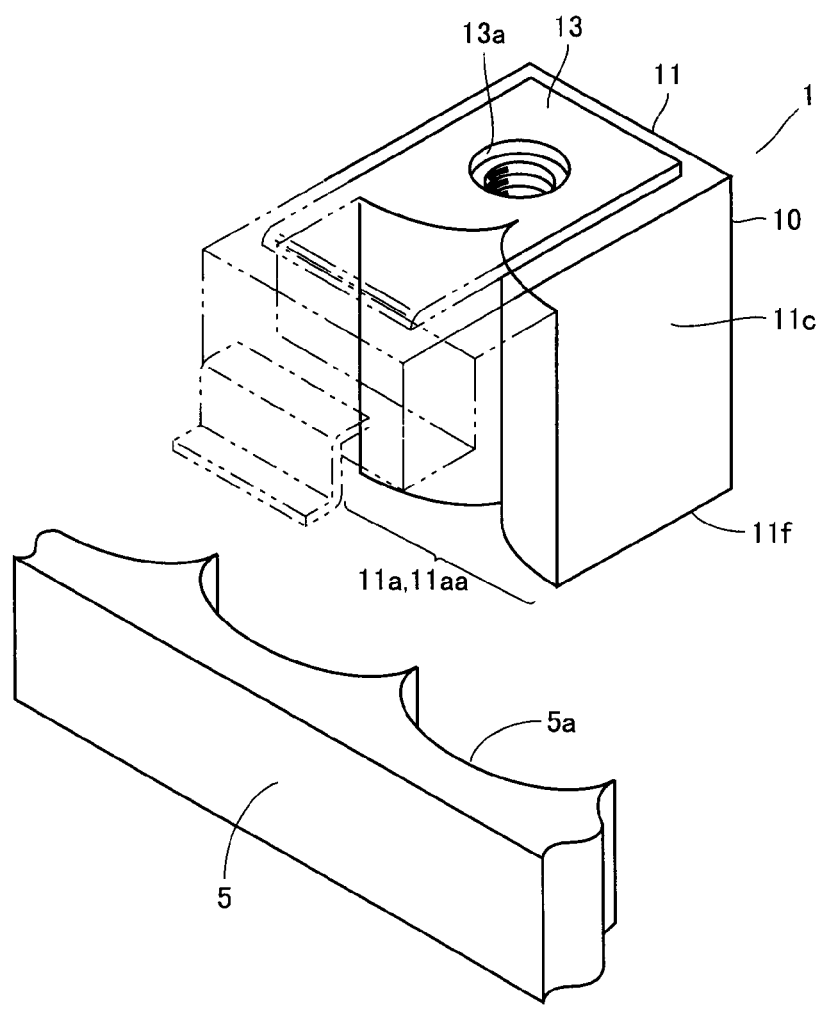
FIG. 36 is a partial perspective view showing the screw block terminal and the sidewall portion of the case member, in accordance with another modification of the embodiment.
Figure 37:
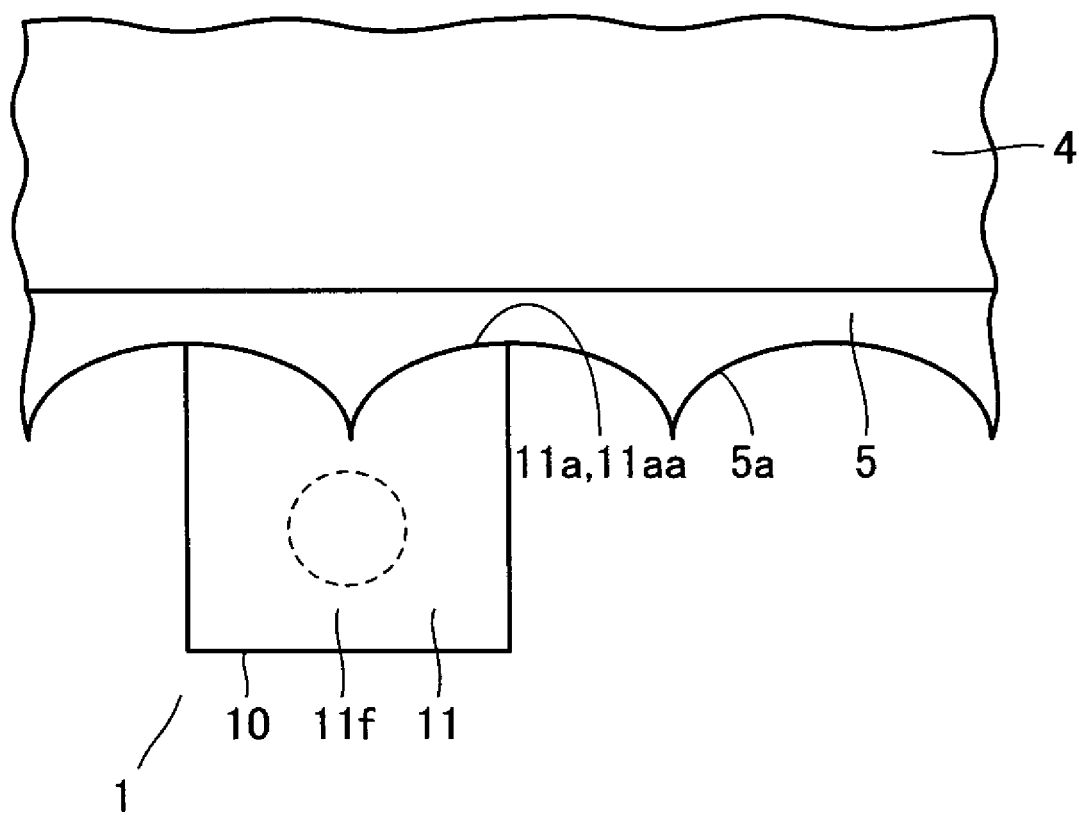
FIG. 37 is a partial bottom view showing the screw block terminal attached to the case member, in accordance with the said another modification of the embodiment.

Further, the rounded protrusions and recesses shown in FIG. 34 may be shifted by half a pitch as shown in FIG. 36. In this case also, contact with wider contact area is established between block body 11 and outer wall surface 5a, when screw block terminal 10 is fixed on case member 2, as shown in FIG. 37. As a result, the stress generated in an operation of tightening the screw is dispersed, resistance to fastening stress acting on block body 11 is improved, and thus, resistance against fastening torque can be improved.

In each of the embodiments above, examples in which a projection is formed on an overhang portion and the projection is fitted in the space between the wall-like bodies to fix the screw block terminal on the case member have been described. The structure is not limiting, and any structure may be used provided that the overhang portion can be fixed on the wall-like body or bodies.

The semiconductor device of the present invention may be effectively used as a semiconductor device for driving an inverter of industrial equipment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a case member having a base plate and a sidewall portion formed along an outer edge of said base plate, and housing a semiconductor mounting board;
   a screw block terminal attached on said case member, and having a block body positioned outside said sidewall portion when attached to said case member and an overhang portion formed overhang from said block body to sandwich said sidewall portion with the block body to be fixed on said case member, for connecting an external terminal by fastening a screw into said block body; and
   a stress relaxing portion provided on said block body for relaxing stress generated in said screw block terminal by an operation of tightening said screw.

2. The semiconductor device according to claim 1, wherein said block body has
   a first side surface portion to be in contact with an outer wall surface of said sidewall portion,
   a second side surface portion opposite to said first side surface portion,
   a third side surface portion extending from one end of said first side surface portion to one end of said second side surface portion, and
   a fourth side surface portion extending from the other end of said first side surface portion to the other end of said second side surface portion and opposite to said third side surface portion; and
   said block body includes a projected contact portion as said stress relaxing portion, projected from each of said third and fourth side surface portions to be in contact with said outer wall surface in a manner expanding contact area of said first side wall surface portion with said outer wall surface.

3. The semiconductor device according to claim 1, comprising
   a plurality of said screw block terminals attached to said case member; and
   a connection fixing member for connecting and fixing said block bodies of two of said plurality of screw block terminals adjacent to each other; wherein
   for one of said two screw block terminals adjacent to each other, the other screw block terminal fixed on said one screw block terminal by said connection fixing member serves as said stress relaxing portion.

4. The semiconductor device according to claim 3, wherein each of said block bodies of said two screw block terminals adjacent to each other has
   a first side surface portion to be in contact with an outer wall surface of said sidewall portion,
   a second side surface portion opposite to said first side surface portion,
   a third side surface portion extending from one end of said first side surface portion to one end of said second side surface portion, and
   a fourth side surface portion extending from the other end of said first side surface portion to the other end of said second side surface portion and opposite to said third side surface portion;
   said third and fourth side surface portions opposite to each other are tapered to be widened gradually from an upper potion to lower portion of said block body, and said second side surface portion is provided with a trench at a prescribed position;
   said connection fixing member includes
   a bridge portion spanning across said two screw block terminals adjacent to each other, and
   first, second and third projected portions respectively formed at prescribed positions on said bridge portion;
   said first projected portion is provided projected at a central portion of said bridge portion and has tapers with the width gradually narrowing from a tip end portion to a root on said bridge portion, so that said first projected portion is fit in a region between said third side surface portion of one block body and said fourth side surface portion of the other block body of said two block bodies;
   said second projecting portion is formed projected from one end side of said bridge portion such that a portion of said one block body is pinched by said first and second projecting portions by fitting said second projecting portion in the trench; and
   said third projecting portion is formed projected from the other end side of said bridge portion such that a portion of said the other block body is pinched by said first and third projecting portions by fitting said third projecting portion in the trench.

5. The semiconductor device according to claim 4, wherein each of said second and third projecting portions is provided with a projection.

6. The semiconductor device according to claim 4, wherein each of said two block bodies further includes projected contact portions projected from said third and fourth side surface portions, to enlarge a contact area of said first side surface portion to be in contact with said outer wall surface.

7. The semiconductor device according to claim 1, wherein
said base plate is arranged on the bottom of said case member for mounting said semiconductor mounting board; and
said block body includes, in addition to the contact surface to the outer wall surface of said sidewall portion, a base plate contact portion extended to said base plate and in contact with a side portion of said base plate, as said stress relaxing portion.

8. The semiconductor device according to claim 1, wherein
said block body includes
a resin body portion formed of resin, and
a base plate contact portion formed of metal, connected to a lower end of said resin body and extending to a side portion of said base plate; and
said resin body is not in contact with the outer wall surface of said sidewall portion, and said base plate contact portion formed of metal is brought into contact with the side portion of said base plate as said stress relaxing portion.

9. The semiconductor device according to claim 8, wherein the side portion of said base plate and said base plate contact portion formed of metal have protrusions and recesses to fit to each other, formed at a portion where the side portion of said base plate and said base plate contact portion formed of metal are in contact with each other.

10. The semiconductor device according to claim 1, wherein
said block body and said sidewall portion have protrusions and recesses to fit to each other as said stress relaxing portion, formed at a portion where said block body and said sidewall portion are in contact with each other.

\* \* \* \* \*